United States Patent [19]
Seki et al.

[11] Patent Number: 5,747,874
[45] Date of Patent: May 5, 1998

[54] SEMICONDUCTOR DEVICE, BASE MEMBER FOR SEMICONDUCTOR DEVICE AND SEMICONDUCTOR DEVICE UNIT

[75] Inventors: Masaaki Seki; Michio Sono; Ichiro Yamaguchi; Kazuhiko Mitobe; Lim Cheang Hai; Koki Otake; Susumu Abe; Junichi Kasai, all of Kawasaki; Masao Sakuma, Tochigi; Yoshimi Suzuki, Tochigi; Yasuhiro Shinma, Tochigi, all of Japan

[73] Assignees: Fujitsu Limited; Fujitsu Automation Limited, both of Kawasaki, Japan

[21] Appl. No.: 529,784

[22] Filed: Sep. 18, 1995

[30] Foreign Application Priority Data

Sep. 20, 1994 [JP] Japan ................. 6-225412
Sep. 20, 1994 [JP] Japan ................. 6-255413

[51] Int. Cl.⁶ .......................................... H01L 23/02
[52] U.S. Cl. .................... 257/686; 257/692; 257/702; 257/783
[58] Field of Search ................................. 257/778, 779, 257/702, 688, 783, 780, 686, 692

[56] References Cited

U.S. PATENT DOCUMENTS

| | | | |
|---|---|---|---|
| 4,635,093 | 1/1987 | Ross | 257/779 |
| 4,682,270 | 7/1987 | Whitehead et al. | 257/702 |
| 4,691,225 | 9/1987 | Myrakami et al. | 257/702 |
| 4,864,470 | 9/1989 | Nishio | 257/783 |
| 5,311,402 | 5/1994 | Kobayashi et al. | 257/779 |

*Primary Examiner*—Tom Thomas
*Assistant Examiner*—Roy Potter
*Attorney, Agent, or Firm*—Nikaido, Marmelstein, Murray & Oram LLP

[57] ABSTRACT

A semiconductor device includes a semiconductor element, a semiconductor device base member having an element mounting portion on which the semiconductor element is mounted, external connection terminals provided on the semiconductor device base member and electrically connected to the semiconductor element, and a resin sealing the semiconductor element. The semiconductor device base member includes a base part and lead parts supported by the base part. The lead parts are electrically connected to the external connection terminals. The semiconductor device base member has bent portions in which the lead parts are located on outer sides of the semiconductor device base member. The bent portions are located in edge portions of the semiconductor device base member.

27 Claims, 20 Drawing Sheets

SEMICONDUCTOR DEVICE, BASE MEMBER FOR SEMICONDUCTOR DEVICE AND SEMICONDUCTOR DEVICE UNIT

BACKGROUND OF THE INVENTION

1. Field of the Invention

The present invention generally relates to semiconductor devices, and more particularly to a semiconductor device having a base member on which a semiconductor element is mounted.

Recently, it has been required to provide semiconductor devices having a package structure which enables high integration, high operation speed, high power and low cost. A package structure of BGA (Ball Grid Array) type has been proposed to meet the above requirement and applied to various electronic devices. The BGA type is one of very attractive package structures.

2. Description of the Related Art

FIG. 1 is a cross-sectional view of a conventional semiconductor device 11, which has a package structure of a plastic BGA (hereinafter simply referred to as a PBGA). The semiconductor device 11 has a printed circuit board 12 having an upper mounting surface 12a to which a single semiconductor element 13 such as a semiconductor chip is fixed by die bonding or the like. The printed circuit board 12 has a lower mounting surface 12b opposite to the upper mounting surface 12a. A plurality of solder bumps 14, which function as external connection terminals, are disposed on the lower mounting surface 12b.

Given electrode patterns (not shown) are provided, by printing, on the upper mounting surface 12a of the board 12 and inner layer portions of the board 12b. Wires 15 are provided between the given electrode patterns formed on the upper mounting surface 12a and the semiconductor element 13, and electrically connect these parts together.

A plurality of through holes 16 are formed in the printed circuit board 12, and function to extend the electrode patterns electrically connected to the semiconductor element 13 to the lower mounting surface 12b of the board 12 and connect these electrode patterns to the solder bumps 14 formed thereon.

A sealing resin 17 hermetically sealing the semiconductor element 13 is formed on the upper mounting surface 12a of the printed circuit board 12 by potting (may be formed by a transfer molding process). The sealing resin 17 is provided to protect the semiconductor element 13, which is embedded therein.

However, the semiconductor device 11 of the PBGA type as described above has the following disadvantages. The sealing resin 17 is likely to flake off from the printed circuit board 12 and thus the reliability of the semiconductor device 11 is low. This is because the printed circuit board 12 is used as a member for mounting the semiconductor element 13 and the sealing resin 17 is provided on the upper surface thereof by the potting or transfer molding process. There is a poor bondability between the printed circuit board 12 and the sealing resin 17. Further, the sealing resin 17 is fixed only to the upper mounting surface 12a of the board 12 by the potting or transfer molding process, so that the mechanical strength obtained at the interface is weak.

Furthermore, the printed circuit board 12 has a low thermal conductivity, and is not capable of efficiently radiating heat from the semiconductor element 13. In addition, the printed circuit board 12 has poor wetproof, and low reliability particularly with respect to thermal stress.

Moreover, the semiconductor device 11 of the PBGA type does not have any electrodes (leads) used to confirm whether the solder bumps 14 are electrically connected to the pattern of the printed circuit board 12 appropriately. Hence, it is impossible to perform a test (called a Field Test) directed to check the electrical connections of the solder bumps 14 to a mounting board after the semiconductor device 11 is mounted on the mounting board.

Similar problems will be encountered in another type of semiconductor devices.

FIGS. 2 and 3 are diagrams of a semiconductor device 110 of having a package structure of QFP (Quad Flat Package) type. The semiconductor device 110 is generally made up of a semiconductor element 111, leads 112, a stage 113 and a resin package 14. The semiconductor element 111 is mounted on the stage 113, and electrode pads 115 are provided on the upper surface of the semiconductor element 111.

The leads 112 include respective inner lead portions 112a and outer lead portions 112b. The inner lead portions 112a are connected to the electrode pads 115 by wires 116. The outer lead portions 112b are shaped into a gull wing suitable for surface mounting. The resin package 114 hermetically seals the semiconductor element 111 and protects the same. The resin package 114 can be formed by transfer molding or the like. The inner lead portions 12a are provided so as to be embedded in the resin package 114. The outer lead portions 112b outwardly extend from the sides of the resin package 114. The semiconductor element 111 has the QFP type package, and hence the outer lead portions 112b outwardly extend from the four sides of the resin package 114.

However, the semiconductor device 110 as described above has the following disadvantages. As the semiconductor element 111 has a higher integration density, the leads 112 become finer and the pitch between the adjacent leads 112 become narrower. As a result, the mechanical strength of the leads 112 is decreased, which allows easy deformation of the leads 112. Hence, it is necessary to perform, before shipping, a lead test which confirms if the leads 112 are suitably provided to the semiconductor element 111. The above test is troublesome. Further, if deformed leads are found, a repairing process must be done to reshape the deformed leads. This is also troublesome.

Further, there is a difficulty in downsizing of the semiconductor device 110 because the leads 112 outwardly extend from the sides of the resin package 114. Furthermore, it is difficult to efficiently radiate heat generated in the semiconductor element 111 because it is hermetically sealed by the resin package 114 and resin generally used to form the package 114 has a poor thermal conductivity.

SUMMARY OF THE INVENTION

It is a general object of the present invention to provide a semiconductor device, a method for producing it, a base member for a semiconductor device and a semiconductor device unit.

A more specific object of the present invention is to provide a semiconductor device, a method for producing it, a base member for a semiconductor device and a semiconductor device unit having improved thermal radiating performance, improved reliability and reduced size.

The above objects of the present invention are achieved by a semiconductor device comprising:

a semiconductor element;

a semiconductor device base member having an element mounting portion on which the semiconductor element is mounted;

external connection terminals provided on the semiconductor device base member and electrically connected to the semiconductor element; and a resin sealing the semiconductor element, the semiconductor device base member comprising a base part and lead parts supported by the base part, the lead parts being electrically connected to the external connection terminals, the semiconductor device base member having bent portions in which the lead parts are located on outer sides of the semiconductor device base member, the bent portions being located in edge portions of the semiconductor device base member.

The above objects of the present invention are also achieved by a method of producing a semiconductor device comprising the steps of:

a) forming a plate including a base part and lead parts;

b) bending the plate so as to form a semiconductor device base member having bent portions and an element mounting portion, the bent portions being located in edge portions of the semiconductor device base member and having the lead parts located on outer portions of the bent portions;

c) mounting a semiconductor element on the element mounting portion;

d) connecting the semiconductor element and the lead parts located in the bent portions together;

e) sealing the semiconductor element by resin; and f) forming external connection terminals on the lead parts.

The above objects of the present invention are achieved by a semiconductor device base member for supporting a semiconductor element of a semiconductor device, the semiconductor device base member comprising:

a base part;

lead parts supported by the base part and connectable to the semiconductor element; and bent portions located in edge portions of the semiconductor device base member, the lead parts being located on outer sides of the semiconductor device base member.

The above objects of the present invention are achieved by a semiconductor device comprising a plurality of semiconductor devices arranged in a stacked formation, each of the plurality of semiconductor devices comprising:

a semiconductor element;

a semiconductor device base member having an element mounting portion on which the semiconductor element is mounted; and a resin sealing the semiconductor element, the semiconductor device base member comprising a base part and lead parts supported by the base part, the lead parts being electrically connected to the semiconductor element, the semiconductor device base member having bent portions in which the lead parts are located on outer sides of the semiconductor device base member, the bent portions being located in edge portions of the semiconductor device base member and exposed from the resin, the bent portions functioning as first external connection terminals electrically connected to the semiconductor element, the lead parts extending on a back surface of the semiconductor device base member opposite to the element mounting portion thereof, the lead parts extending on the back surface function as second external connection terminals, the first external connection terminals of an upper one of the semiconductor devices being in contact with the second external connection terminals of a lower one of the semiconductor devices.

The above objects of the present invention are achieved by a method of producing a semiconductor device comprising the steps of:

a) forming a plate including a base part and lead parts;

b) bending the plate a plurality of times so as to form a semiconductor device base member having bent portions and an element mounting portion, the bent portions being located in edge portions of the semiconductor device base member and having the lead parts located on outer portions of the bent portions;

c) mounting a semiconductor element on the element mounting portion;

d) connecting the semiconductor element and the lead parts located in the bent portions together;

e) sealing the semiconductor element by resin; and f) forming external connection terminals on the lead parts.

Another object of the present invention is to provide a case for supporting an element comprising:

a base member having an element mounting portion on which the element is mounted; and external connection terminals provided on the base member and electrically connected to the element, the base member comprising a base part and lead parts supported by the base part, the lead parts being electrically connected to the external connection terminals, the base member having bent portions in which the lead parts are located on outer sides of the base member, the bent portions being located in edge portions of the base member.

Yet another object of the present invention is to provide a case for supporting an element comprising:

a base member having an element mounting portion on which the element is mounted, the base member comprising a base part and lead parts supported by the base part, the lead parts being electrically connected to the element, the base member having bent portions in which the lead parts are located on outer sides of the base member, the bent portions being located in edge portions of the base member, the bent portions functioning as external connection terminals electrically connected to the element.

A further object of the present invention is to provide a device comprising:

a SAW element;

a base member having an element mounting portion on which the SAW element is mounted;

external connection terminals provided on the base member and electrically connected to the SAW element; and a resin sealing the SAW element, the base member comprising a base part and lead parts supported by the base part, the base part being connectable to ground, the lead parts being electrically connected to the external connection terminals, the base member having bent portions in which the lead parts are located on outer sides of the base member, the bent portions being located in edge portions of the base member.

A still further object of the present invention is to provide a device comprising:

a SAW element;

a base member having an element mounting portion on which the SAW element is mounted; and a resin sealing the SAW element, the base member comprising a base part and lead parts supported by the base part, the base part being connectable to ground, the lead parts being electrically connected to the SAW element, the base member having bent portions in which the lead parts are located on outer sides of the base member, the bent portions being located in edge portions of the base member and exposed from the resin, the bent portions functioning as external connection terminals electrically connected to the SAW element.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 4:
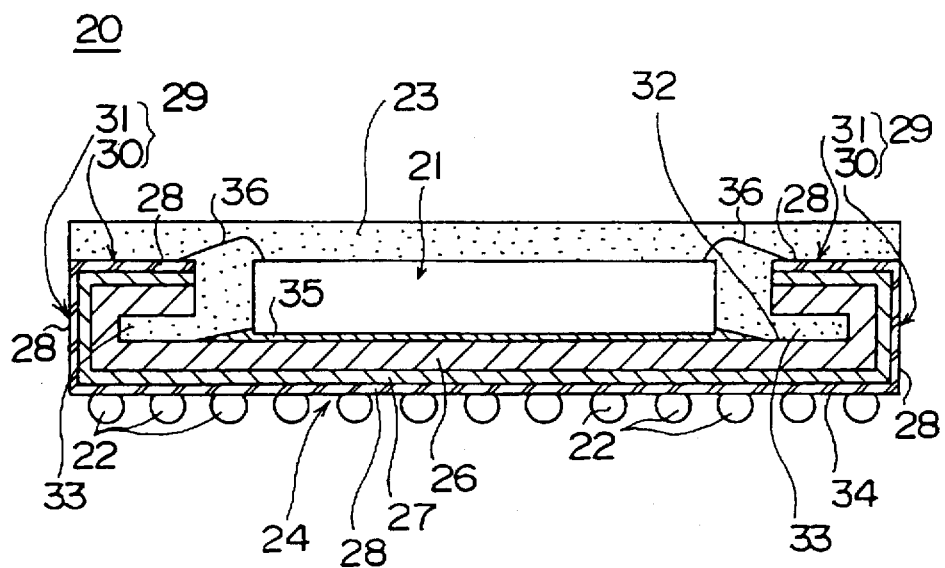
FIG. 4 is a cross-sectional view of a semiconductor device according to a first embodiment of the present invention.

FIG. 4 is a cross-sectional view of a semiconductor device 20 according to a first embodiment of the present invention. The semiconductor device 20 includes a semiconductor element 21 such as a semiconductor chip, solder bumps 22 functioning as external connection terminals, a sealing resin 23 (stippled area), and a semiconductor device base member 24.

Figure 13:
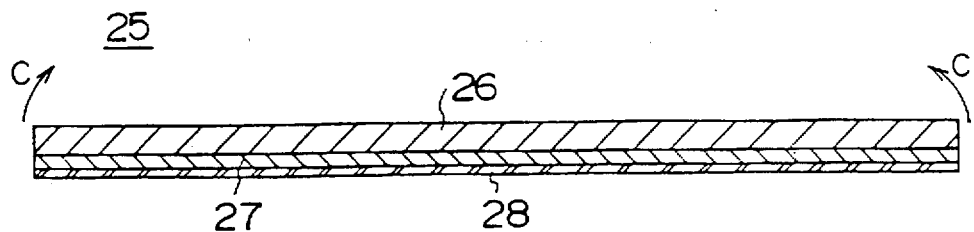
FIG. 13 is a cross-sectional view showing a plate forming step.
Figure 14:
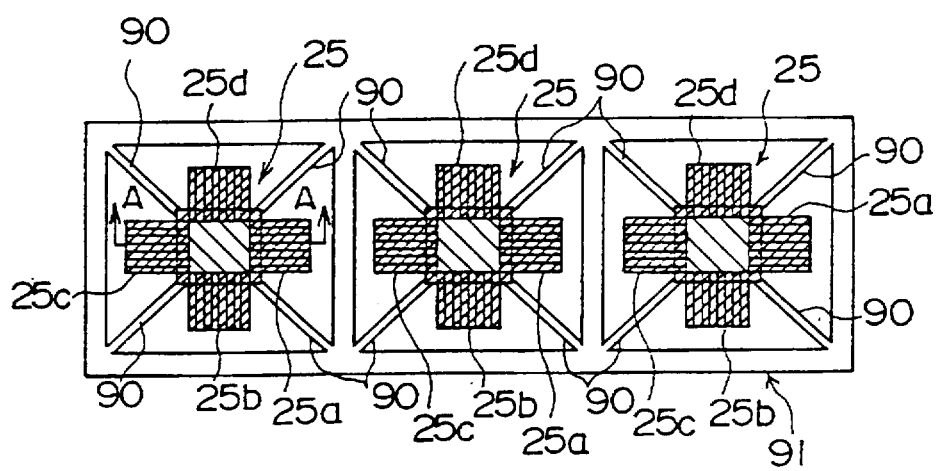
FIG. 14 is a plan view showing the plate forming step.
Figure 15:
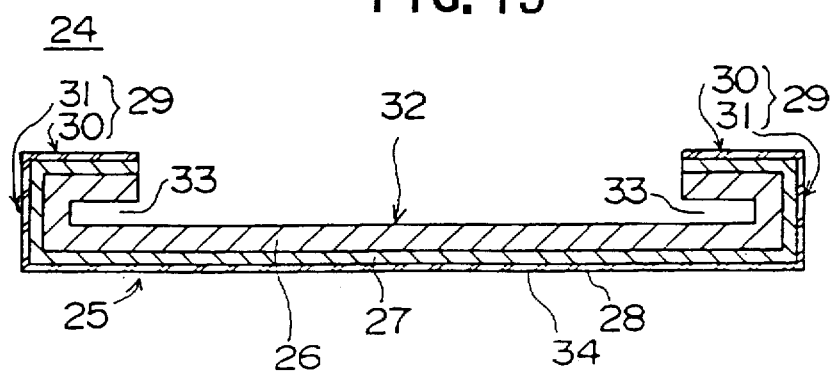
FIG. 15 is a cross-sectional view showing a plate bending step.
Figure 16:
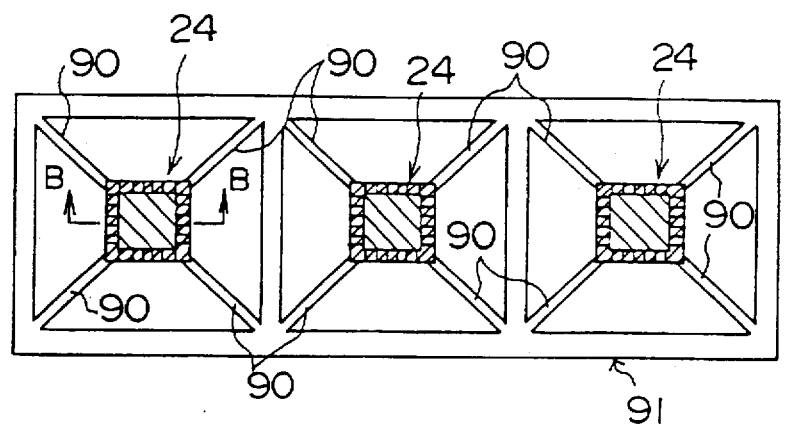
FIG. 16 is a plan view showing the plate bending step.

The base member 24 is formed by bending a plate 25 shown in FIGS. 13 and 14. FIGS. 15 and 16 show the semiconductor device base member 24 before the semiconductor device 20 is placed therein. FIG. 13 is a cross-sectional view taken along line A—A shown in FIG. 14, and FIG. 16 is a cross-sectional view taken along line B—B.

As shown in FIGS. 13 and 14, the plate 25 has a three-layer structure made up of a base part 26, an insulating layer 27 and lead parts 28 arranged in a stacked formation. The base part 26 is formed of, for example, a metallic material such as copper (Cu) having a good thermal conductivity and a good bending-processability. The insulating layer 27 provided on the base part 26 is made of, for example, polyimide resin. The lead parts 28 provided on the insulating layer 27 are made of copper as in the case of the base part 26, and has a given pattern formed by etching.

The base part 26 is relatively thick enough to obtain a mechanical strength necessary for the semiconductor device base member 24. The lead parts 28 function as wires for electrically connecting the semiconductor element 21 and the solder bumps 22 together, as will be described later. The lead parts 28 do not have a thickness as large as the base part 26. The insulating layer 27 made of, for example, polyimide resin, is interposed between the base part 26 and the lead parts 28, which parts are both electrically conductive. Hence, the insulating layer 27 electrically insulates the base part 26 and the lead parts 28 from each other. The insulating layer 27 also function as an adhesive which adheres the base part 26 and the lead parts 28 together.

As shown in FIG. 14, the plate 25 has a cross shape before the bending process. The base member 24 shown in FIGS. 4 and 15 is formed by bending extensions 25a–25d extending in four orthogonal directions. When bending the extensions 25a–25d, the plate 25 is loaded to a press apparatus so that the lead parts 28 are located on the upper side of the apparatus and the base part is located on the lower side thereof, as shown in FIG. 13. Then, the extensions 25a–25d is inwardly bent (that is, in the direction indicated by arrow C in FIG. 13), so that bent portions 29 are formed.

As shown in FIGS. 4 and 15, the bent portions 29 have approximately C-shaped cross-sections so as to have upper portions 30 and side portions 31. A portion of the plate 25 which is not subjected to the bending process is used as an element mounting portion 32 on which the semiconductor element 21 can be mounted.

The upper portions of the bent portions 29 extend in parallel to the element mounting portion 32. The side portions 31 of the bent portions 29 stand upright with respect to the element mounting portion 32. There are gaps 33 between the element mounting portions 32 and the upper portions 30 due to the approximately C-shaped cross-sections of the bent portions 29.

The lead parts 28 form outer portions of the semiconductor device base member 24. The lead parts 28 have the upper portions 30 to which the semiconductor element 21 is electrically connected, and has a lower mounting portion 34 on which the solder bumps 22 are provided, while the upper portions 30 and the lower mounting portion 34 are electrically connected together via the side portions 31. That is, by simply bending the plate 25, it is possible to extend the lead parts 28 from the positions to which the semiconductor element 21 is connected to the positions in which the semiconductor bumps 22 are formed.

It will be noted that the conventional BGA type semiconductor device 11 (FIG. 1) needs the through holes formed in the printed circuit plate 12 or printed wiring patterns formed on the plate surface in order to make electrical connections between the semiconductor element 13 and the solder bumps 14. The structure of the first embodiment of the present invention can make electrical connections between the semiconductor element 21 and solder bumps 22 simply by bending the plate 25 having the three-layer structure. Hence, the semiconductor device base member 24 can be easily produced economically.

Turning to FIG. 4 again, the semiconductor element 21 is mounted on the element mounting portion 32 of the base member 24. More particularly, the semiconductor element 21 is fixed to the element mounting portion 32 by solder which has an excellent stress buffer effect as a die attachment member 35, which may be electrically conductive paste or a tape material.

The semiconductor element 21 mounted on the element mounting portion 32 and the lead parts 28 of the bent portions 29 are electrically connected together by wires 36. Such connections can easily be made by a wire bonding apparatus widely used. The lead parts 28 are formed on the upper surfaces of the bent portions 29, so that the semiconductor element 21 is approximately as high as the lead parts 28. This contributes to reducing the movement of a capillary of the wire bonding apparatus and facilitates the wire bonding process.

A large number of solder bumps 22 are arranged on the mounting surface 34 of the semiconductor device base member 24. The solder bumps 22 are connected to the lead parts 28 which are patterned on the mounting surface 34. Hence, the semiconductor element 21 is electrically connected to the solder bumps 22 via the wires 36 and the lead parts 28.

The sealing resin 23 hermetically seals the semiconductor element 21 and protects the same. As will be described later, the sealing resin 23 is filled on the upper surface of the semiconductor device base member 24 by potting (or transfer molding). As has been described previously, there are the gaps 33 between the upper portions 30 and the element mounting portions 32 due to the formation of the bent portions 29. Hence, the gaps 33 are filled with the sealing resin 23 by potting.

The portions of the sealing resin 23 located in the gaps 33 provide an anchor effect, which improves the mechanical joint strength between the sealing resin 23 and the base member 24. Hence, it is possible to prevent the sealing resin 23 from flaking off from the base member 24 and to improve the reliability of the semiconductor device 20. The bent portions 29 also function to prevent unwanted flow of resin, so that the semiconductor element 21 can be certainly sealed by resin in the semiconductor device base member 24.

The base part 26 occupies most of the semiconductor device base member 24, and is made of copper. Hence, it is possible to reduce the hygroscopic degree of the base part 26, in other words, the semiconductor device base member 24.

When the semiconductor deice 20 is mounted to a mounting (mother) board 37 (FIG. 12), a heat treatment is performed in order to connect the solder bumps 22 to electrode parts 38 formed on the mounting board 37. In the heat treatment, no stream occurs due to heat because the semiconductor device base member 24 has a low hygroscopic degree. Hence, it is possible to prevent a crack in the sealing resin 23 and prevent the flake-off of the sealing resin 23 from the base member 24. As a result, the reliability of the semiconductor device 20 can be improved.

The base part 26 is formed of copper (Cu) having a good thermal conductivity, as has been described previously. Hence, it is possible to efficiently radiate heat generated in the semiconductor element 21 through the base part 26 made of a high thermal conductive material which may be copper. The portion of the semiconductor device base member 24 other than the portion in which the sealing resin 23 is provided is exposed, so that the base member 24 has a high thermal radiating efficiency. That is, the base member 24 functions as a heat radiating member, so that the semiconductor element 21 can be cooled efficiently and effectively.

The end portions of the plate 25 are inwardly bent so as to form the bent portions 29, which are close to the semiconductor element 21 mounted on the element mounting portion 32. That is, the shape of the semiconductor device base member 24 is similar to that of the semiconductor element 21, so that down-sizing of the semiconductor device 20 can be achieved.

The semiconductor device 20 has the solder bumps 22 serving as external connection terminals, the solder bumps 22 being arranged on the mounting surface 34 of the bottom of the base member 24. Hence, the semiconductor device 20 can be used in a manner equivalent to that of using BGA-type semiconductor devices. Hence, it is not necessary to consider a deformation of the external connection terminals. This enables use of an increased number of terminals and more effective mounting.

Figure 12:
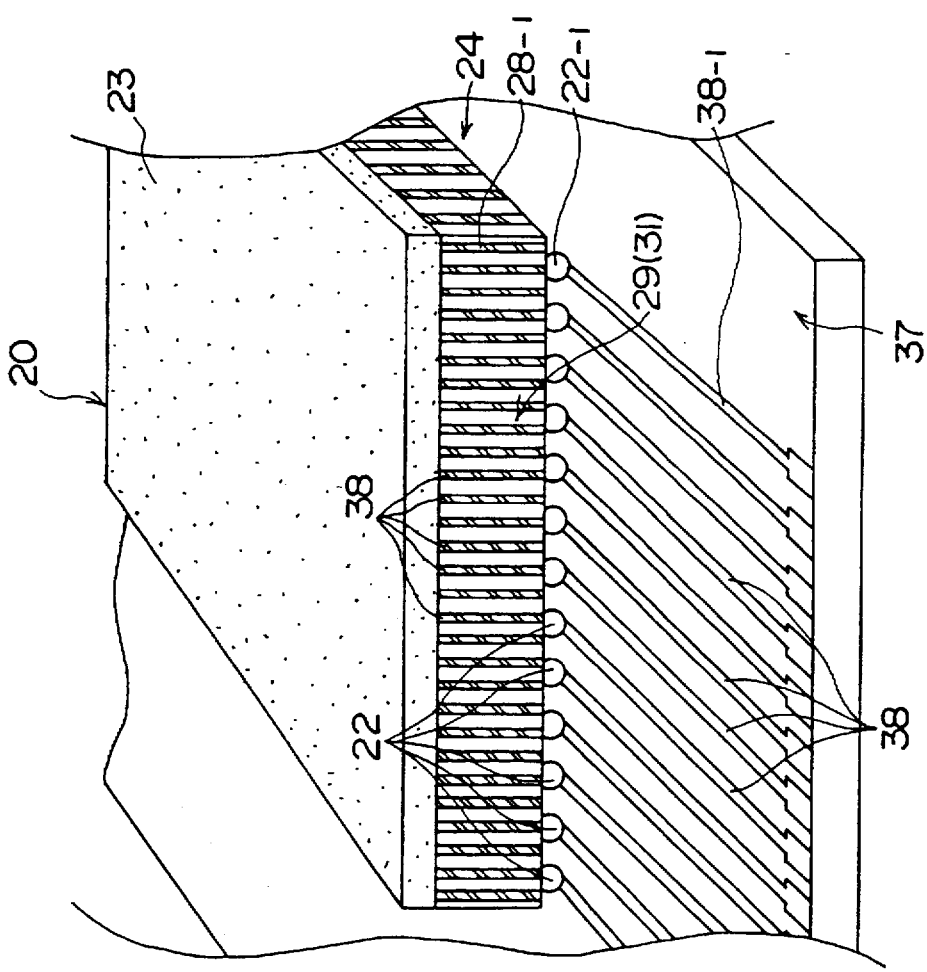
FIG. 12 is a perspective view of a state in which the semiconductor device of the first embodiment of the present invention is mounted on a mounting board.

FIG. 12 is a schematic view of a state in which the semiconductor device 20 is mounted on the mounting board 37. As has been described previously, there are a large number of electrode parts 38 formed on the main surface of the mounting board 37. The solder bumps 22 of the semiconductor device 20 are connectable to the electrode parts 38.

The solder bumps 22 are arranged on the mounting surface 34 of the semiconductor device base member 24 in the two-dimensional formation. It is difficult to determine whether some of the solder bumps 22 located in the center portion on the mounting surface 34 are certainly connected to the electrode parts 38 of the mounting board 37.

In this regard, the semiconductor device 20 is configured so that the lead parts 28 extend on the sides 31 of the bent portions 29 of the base member 24. That is, the leads parts 28 connected to the solder bumps 22 can be accessed on the side portions 31 of the semiconductor device base member 24. Hence, if the solder bumps 22a are certainly connected to the electrode parts 38 of the mounting board 37, there is no doubt that the lead parts 28 are electrically connected to the electrode parts 38. Hence, it is possible to determine if the solder bumps 22 are certainly connected to the electrode parts 38 by determining whether the lead parts 28 located on the side portions 31 of the bent portions 29 are electrically connected to the electrode parts 38.

A further description will be given below. It will now be assumed that solder bump 22-1 shown in FIG. 12 is electrically connected to electrode part 38-1 of the mounting board 37 (the following description holds true for other solder bumps located in the inner area while the solder bump 22-1 is located in the outer area). In order to determine whether the solder bump 22-1 is suitably connected to the electrode part 38-1, test probes are respectively connected to lead part 28-1 connected to the solder bump 22-1 and the electrode part 38-1. Then, it is checked whether the lead part 28-1 and the electrode part 38-1 are electrically connected together by means of a tester or the like.

As shown in FIG. 12, the lead part 28-1 and the electrode part 38-1 are both exposed to the outside of the device, and hence the test probes can be easily attached thereto. Hence, it is possible to perform the test in the state in which the semiconductor device 20 is mounted on the mounting board 37 and the solder bumps 22 are connected to the electrode parts 38. A defective portion can be definitely identified, and a necessary process such as a repairing process can be performed based on the results of the above test, so that the yield and reliability can be improved.

In FIG. 12, the lead parts 28 located on the side portions 31 of the bent portions 29 have an identical width over the lengths thereof. Hence, it may be somewhat difficult to attach the test probes to the lead parts 28.

Figure 19:
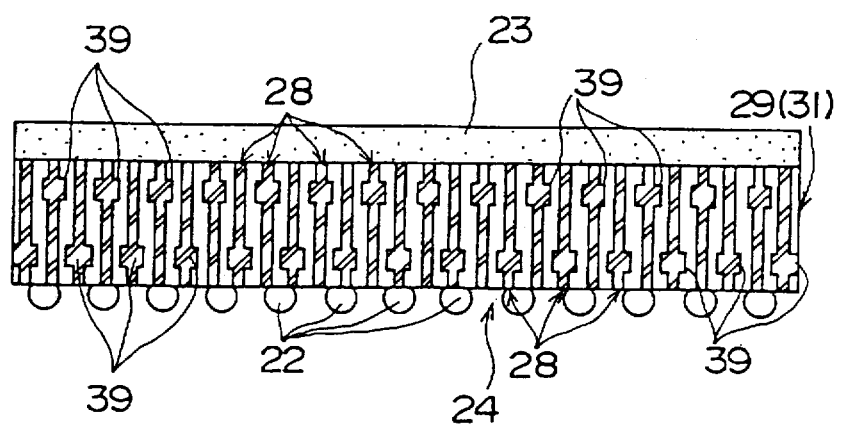
FIG. 19 is a cross-sectional view of a semiconductor device which includes lead parts having land portions located on sides of bent portions of the base member.

A semiconductor device 20A shown in FIG. 19 has improved lead parts 28 so that the lead parts 28 have land portions 39 wider than the other portions of the lead parts 28. The test probes can be easily attached to the land portions 39. Further, the land portions 39 may be arranged in a zigzag formation, which makes it possible to provide the land portions 39 while the lead parts 28 are arranged with narrow pitches.

Figure 5:
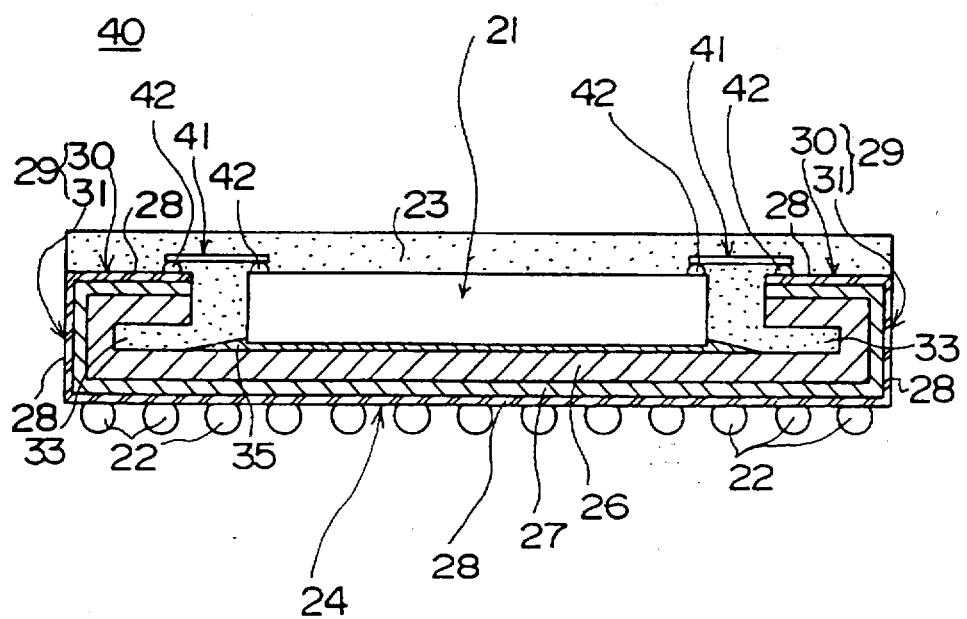
FIG. 5 is a cross-sectional view of a semiconductor device according to a second embodiment of the present invention.

FIG. 5 is a cross-sectional view of a semiconductor device 40 according to a second embodiment of the present invention. In FIG. 5, parts that are the same as those shown in FIG. 4 are given the same reference numbers, and a description thereof will be omitted.

The semiconductor device 40 is characterized in that the semiconductor element 21 and the bent portions 29 are electrically connected together by means of TAB (Tape Automated Bonding) wires 41. The TAB wires 41 are wiring patterns formed on a resin film. Bumps 42 are provided on the semiconductor element 21 and the lead parts 28. The TAB wires 41 are connected to the bumps 42, so that the semiconductor element 21 and the lead parts 28 are electrically connected together.

The use of the TAB wires 41 makes it possible to connect the semiconductor element 21 and the lead parts 28 of the bent portions 29 by means of a simple process which may be thermo-compression bonding. The TAB is suitable for automation, and the wiring patterns can be formed with narrow pitches. Hence, use of the TAB wires 41 is suitable for the semiconductor element 21 which has a large number of terminals arranged at a high density.

Figure 6:
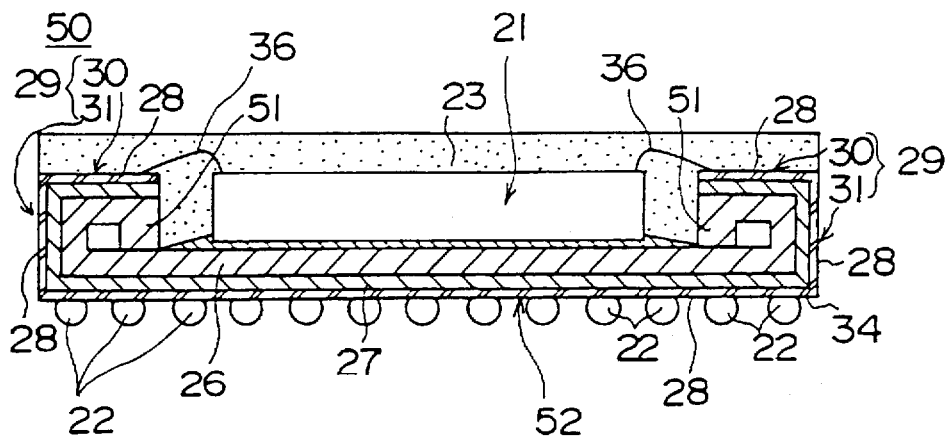
FIG. 6 is a cross-sectional view of a semiconductor device according to a third embodiment of the present invention.

FIG. 6 is a cross-sectional view of a semiconductor device 50 according to a third embodiment of the present invention. In FIG. 6, parts that are the same as those shown in the previous figures are given the same reference numbers. The semiconductor device 50 has a semiconductor device base member 52, which has projections 51. These projections 51 are parts of the base part 26 and are located between the upper portions 30 of the bent portions 29 and the element mounting portion 32. The upper portions 30 of the bent portions 29 are supported on the element mounting portion 32 through the projections 51.

Figure 7:
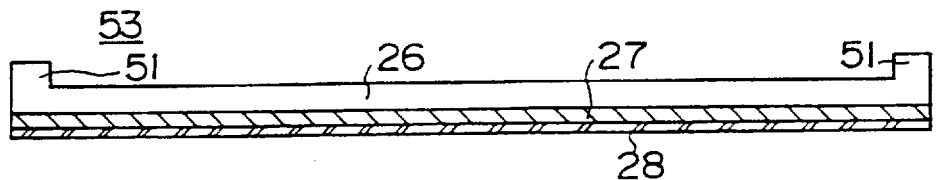
FIG. 7 is a cross-sectional view of a base member used for the semiconductor device according to the third embodiment of the present invention.

The semiconductor device base member 52 is formed by bending a plate 53 shown in FIG. 7. The plate 53 has the projections 51 which are located at the outer edge portions of the plate 53 and extend upwards. The end portions of the plate 53 including the projections 51 are bent so that substantially C-shaped cross-sections can be formed.

As shown in FIG. 6, the ends of the projections 51 are in contact with the element mounting portion 32, so that the bent portions 29 (particularly, the upper portions 30) are supported by the projections 51. Hence, even when the wire bonding is carried out by an ultrasonic welding method in order to connect the wires 36 to the semiconductor element 21 and the lead parts 28, the projections 51 function to prevent the bent portions 29 from being vibrated due to ultrasonic waves applied thereto. It will be noted that the upper portions 30 of the bent portions 29 of the semiconductor device 20 according to the first embodiment of the present invention are like cantilevers. Hence, the bent portions 29 may be vibrated when an ultrasonic vibrator is attached to a wire connecting position. This prevents the ultrasonic welding. As described above, the projections 51 prevents the bent portions 29 from being vibrated, so that the reliability of wire bonding can be improved.

Figure 8:
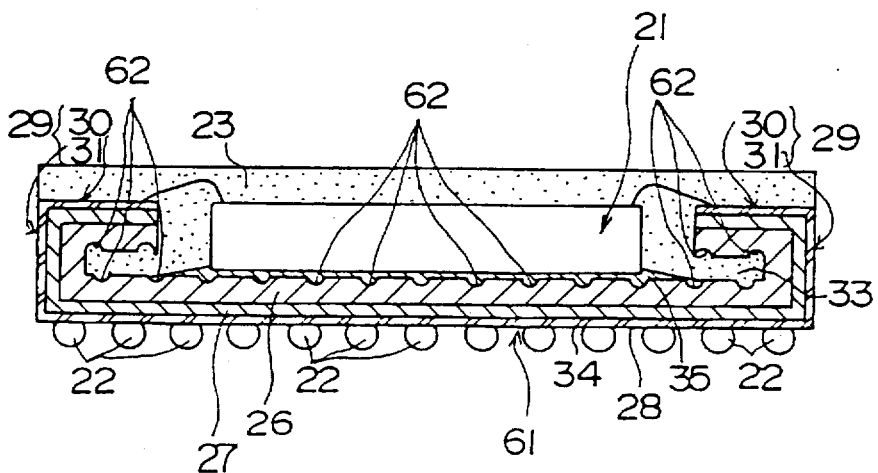
FIG. 8 is a cross-sectional view of a semiconductor device according to a fourth embodiment of the present invention.

FIG. 8 is a cross-sectional view of a semiconductor device 60 according to a fourth embodiment of the present invention. In FIG. 8, parts that are the same as those shown in the previously described figures are given the same reference numbers. The semiconductor device 60 employs a semiconductor device base member 61 having a rough element mounting surface 62. More particularly, the element mounting surface 62 has convex or concave portions, in other words, dimples. The semiconductor element 21 is mounted on the element mounting surface 62. The dimples are arranged beyond the area on which the semiconductor element 21 is placed. In other words, the dimples are in contact with the sealing resin 23. The dimples can be formed by press in the process of bending the plate 25. Alternatively, the dimples can be formed by using a punch or etching before bending the plate 25. The dimples shown in FIG. 8 have a semi-spherical shape, and may have arbitrary shapes.

The dimples function to increase the contact area of the element mounting portion 32 and the area of contacting the sealing resin 23. Hence, it is possible to improve the bondability between the semiconductor element 21 and the element mounting portion 32 (particularly part 26) and the bondability between the sealing resin 23 and the base part 26. This makes it possible to improve the fixing of the semiconductor element 21 to the base member 61 and prevent the sealing resin 23 from flaking off from the base member 61. As a result, the reliability of the semiconductor device 60 can be improved.

Figure 9:
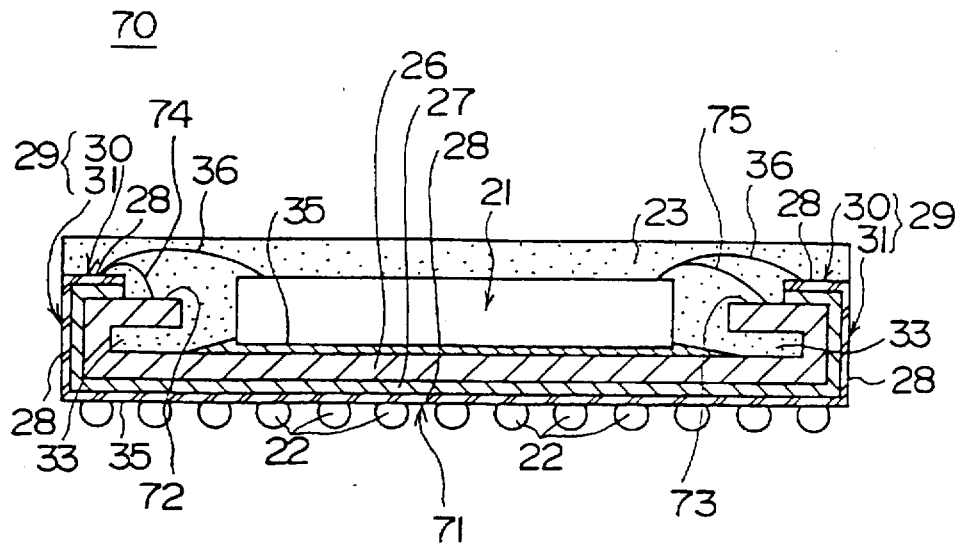
FIG. 9 is a cross-sectional view of a semiconductor device according to a fifth embodiment of the present invention.

FIG. 9 is a cross-sectional view of a semiconductor device 70 according to a fifth embodiment of the present invention. In FIG. 9, parts that are the same as those shown in the previously described figures are given the same reference numbers. The semiconductor device 70 is characterized in that the base part 26 of a semiconductor device base member 71 is positively utilized as a lead member. The insulating layer 27 and the lead parts 28 are partially removed from the bent portions 29, so that base connecting parts 72 and 73 are formed. At the base connecting part 72, wires 74 are arranged between the base part 26 and the lead parts 28. At the base connecting part 73, wires 75 are arranged between the semiconductor element 21 and the base part 26.

As has been described previously, the base part 26 is made of an electrically conductive material which may be copper. The semiconductor element 21 and the base part 26 is electrically connected while the insulating layer 27 is interposed between the base part 26 and the lead parts 28. Hence, the base part 26 can be used as a lead member. The base part 26 may be patterned into lead members. The lead members are provided by not only the lead parts 28 but also the base part 26, so that an increased degree of freedom in routing of the wires extending from the semiconductor element 21 to the solder bumps 22 can be obtained.

As has been described previously, the base part 26 is relatively thick and extend over the whole of the semiconductor device base member 71. Hence, the base part 26 has a relatively small resistance. The base part 26 can be utilized as a ground line or a power supply line. In this case, the electrical performance of the semiconductor device 70 can be improved.

Figure 10:
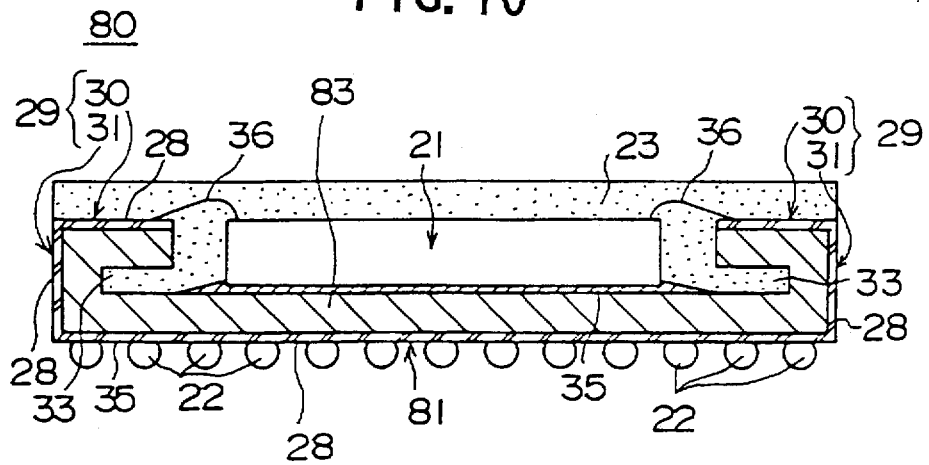
FIG. 10 is a cross-sectional view of a semiconductor device according to a sixth embodiment of the present invention.
Figure 11:
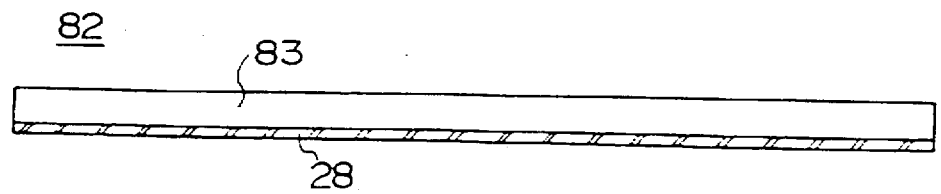
FIG. 11 is a cross-sectional view of a base member used for the semiconductor device according to the sixth embodiment of the present invention.

FIG. 10 is a cross-sectional view of a semiconductor device 80 according to a sixth embodiment of the present invention. In FIG. 10, parts that are the same as those shown in the previously described figures are given the same reference numbers. The semiconductor device 80 employs a semiconductor device base member 81 obtained by bending a plate 82 shown in FIG. 11. The plate 82 is made up of a base part 83 made of an insulating substance, and the lead part 28 directly arranged on the base part 83.

The base part 83 is made of heat-resistant, thermosofting insulating resin (plastics). The lead part 28 is formed on the base part 83 by bonding or plating. The plate 82 is bent in a high-temperature environment in which the insulating resin forming the base part 83 can be softened. Use of the base part 83 as described above simplifies the structure of the plate 82 and facilitates the process-ability of the plate 82. Use of resin to form the base part 83 improves the bondability between the sealing resin 23 and the base part 83 and prevents the flake-off of the sealing resin 23. As a result, the reliability of the semiconductor device 80 can be improved.

A description will now be given, with reference to FIGS. 13 through 18, of a method of producing the semiconductor device 20 configured according to the first embodiment of the present invention. In these figures, the parts that are the same as those shown in the previously described figures are given the same reference numbers.

The production method includes a plate forming step, a lead shaping step, a plate bending step, an element mounting step, a connecting step, a resin sealing step and an external connection terminal forming step.

In the plate forming step, a three-layer structure made up of the base part 26, the insulating layer 27 and the lead parts 28 is formed. Next, the three-layer structure is stamped by pressing so that the plates 25 each having a cross shape in plan as shown in FIG. 14 can be formed. The plates 25 are then plated with nickel (Ni) and gold (Au) in order to prevent oxidation of copper and improve the wire bondability in the wire bonding process.

Figure 1:
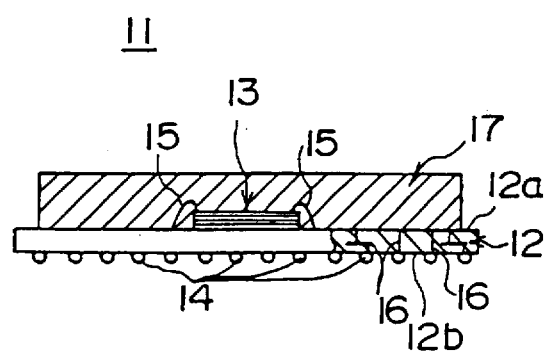
FIG. 1 is a cross-sectional view of a conventional semiconductor device.

It will be noted that the above plate forming step does not need the steps of forming through holes and stacking a plurality layers, the above steps being needed for the conventional BGA-type semiconductor device 11 shown in FIG. 1. Hence, the plate 25 can be easily produced. In the stamping process by pressing, a plurality of three-layer structures can be stamped at one time, so that a number of plates 25 can be produced efficiently.

In FIG. 14, plates 25 are supported by a frame 91 by means of support bars 90. It is possible to separate these plates 25 from each other at the time of the press-stamping process.

In the above step of forming the plate 25, the lead shaping step is carried out after the base part 26, the insulating layer 27 and the lead parts 28 are stacked. Although not shown, in the lead shaping step, the lead parts 28 of each of the plates 25 are formed in a predetermined pattern. The following description will be directed to one plate 25 for the sake of convenience although a plurality of plates 25 supported by the frame 91 can be simultaneously processed.

More particularly, a resist is deposited, by photolithograph technique, on portions of the lead parts 28 on the plate 25, the above portions corresponding to patterned leads 28. Then, an etching step is executed to remove the unnecessary portions. Thus, the lead parts 28 having the predetermined pattern are formed as shown in FIG. 12.

After the lead forming step, the step of bending the plate 25 is performed. FIGS. 15 and 16 show the semiconductor device base members 24 formed by the plate bending step. In this step, the edge portions of the plate 25 (the cross-shaped edge portions) are inwardly bent so that the lead parts 28 are located in the outer ends of the base member 24. The direction of bending the plate 25 is indicated by arrow C shown in FIG. 13. The bending step results in the element mounting portion 32 and the bending parts 29. It can be seen from the above that the semiconductor device base member 24 can be easily and efficiently formed by the above simple process.

The step of bending the plate 25 is performed by the press step, which makes it possible to precisely and easily form the semiconductor device base member 24. Further, the punching process executed in the plate forming step and the bending process executed in the bending step can be performed by a single press apparatus. This leads to an improvement in the efficiency of the formation of a large number of semiconductor device base members 24.

Figure 17:
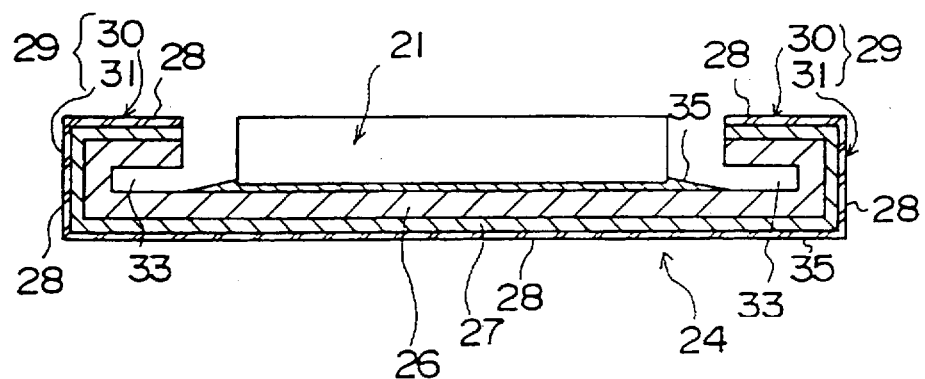
FIG. 17 is a cross-sectional view showing a element mounting step.

Subsequently, the element mounting step is executed, in which the semiconductor element 21 is placed on and fixed to the element mounting portion 32 of the base member 24 by using a bonding member such as solder. FIG. 17 shows a state in which the semiconductor element 21 is mounted on the element mounting portion 32 of the semiconductor device base member 24.

Figure 18:
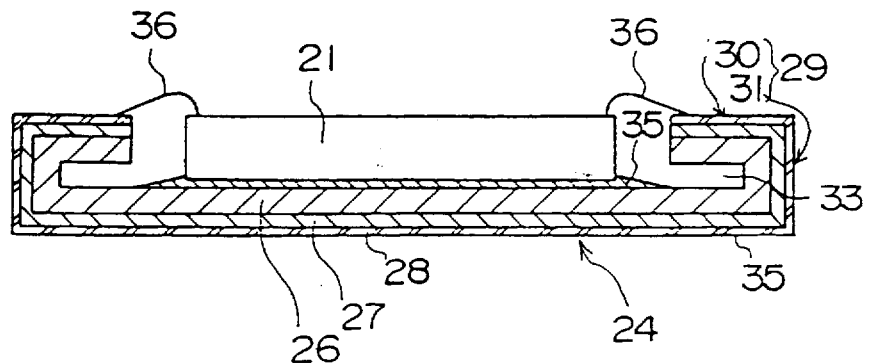
FIG. 18 is a cross-sectional view showing a connecting step.

A subsequent step is the connecting step using the wire bonding apparatus. In this step, the wires 36 are provided between the semiconductor element 21 and the lead parts 28. The lead parts 28 are positioned on the top of the bent portions. Hence, there is no problem about bonding with respect to the base member 24 having a unique structure. FIG. 18 shows a state in which the wires 36 are provided between the semiconductor element 21 and the lead parts 28.

Subsequent to the connecting step, the resin sealing step is performed in which the sealing resin 23 is provided from the upper side of the base member 24 by potting or transfer mold (potting is shown in the present embodiment) so that the semiconductor device 21 is encapsulated. The sealing resin 23 is provided in the gaps 33 between the bent portions 29 and the element mounting portion 32, and thus the anchor effect can be obtained.

The resin sealing step is followed by the step of forming the external connection terminals. The solder bumps 22 functioning as the external connection terminals are formed in given positions on the mounting surface 34 of the semiconductor device base member 24. The solder bumps 22 can be provided by using solder balls having an even size. A solder paste is coated on the solder bump forming positions on the mounting surface 34. The solder balls are placed on the paste, and is heated.

Finally, the semiconductor device base members 24 are separated from the support bars 90, so that a plurality of semiconductor devices 20 are formed.

In the above-described embodiments of the present invention, various variations and modifications may be made. For example, copper used to form the base member 26 can be replaced by another electrically conductive material which may be aluminum, an alloy of copper, or an alloy of iron.

A description will now be given of a semiconductor device 120 according to a seventh embodiment of the present invention. The semiconductor device 120 is mainly made up of a semiconductor element 121 such as a semiconductor chip, a sealing resin 123 and a semiconductor device base member 124 equipped with external connection terminals 122.

Figure 27A:
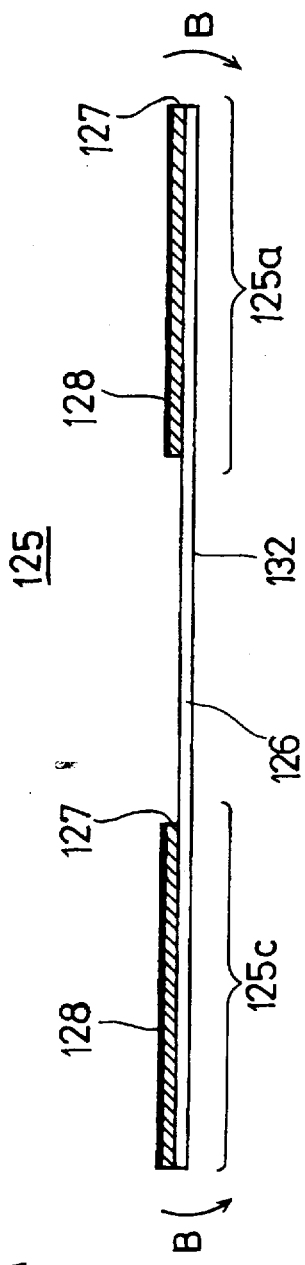
FIGS. 27A and 27B are diagrams showing a plate forming step.
Figure 27B:
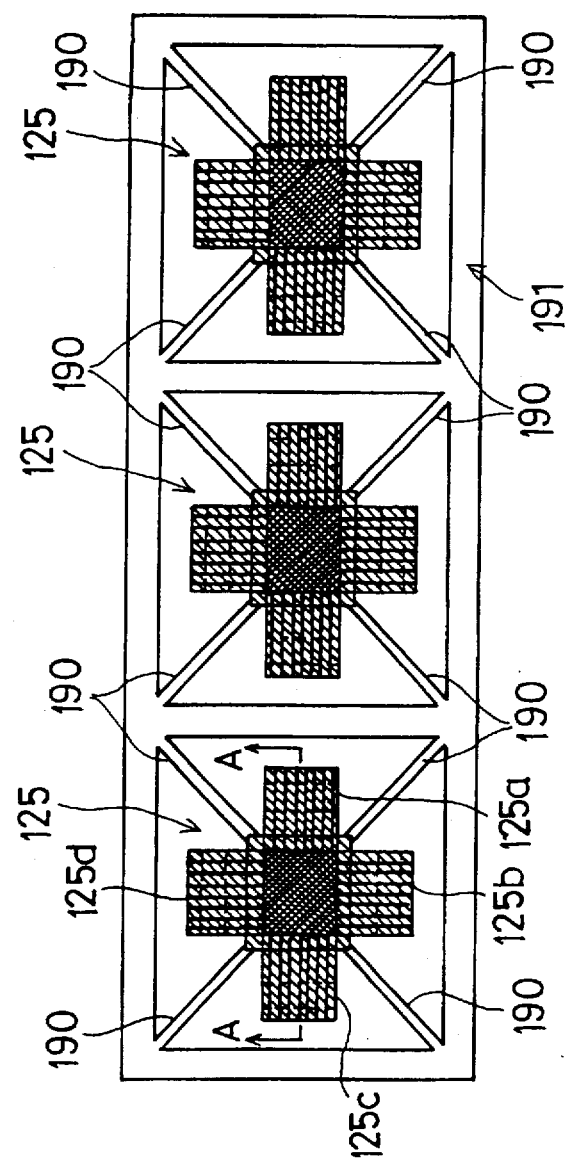
Figure 29:
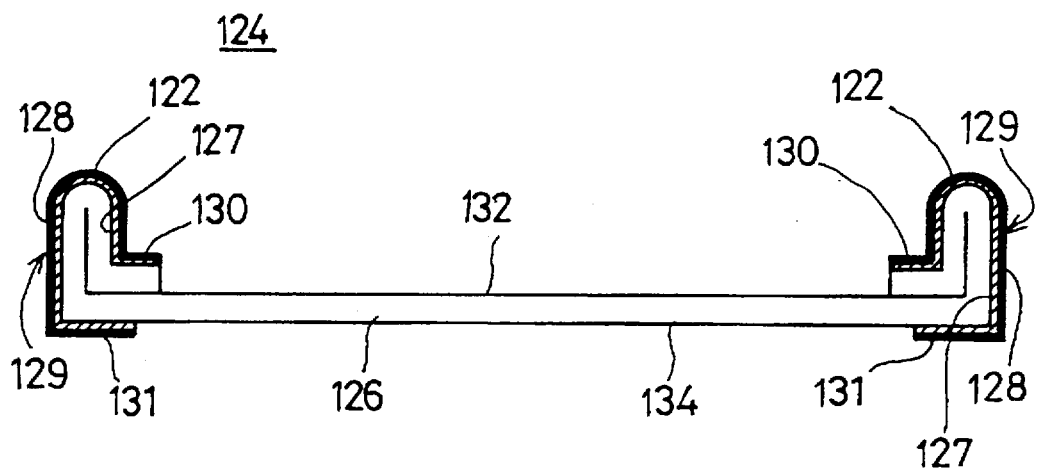
FIG. 29 is a cross-sectional view showing a completed semiconductor device base member.

The semiconductor device base member 124 is formed by bending a plate 125 shown in FIGS. 27A and 27B. FIG. 29 shows the semiconductor device base member 124 before it is provided in the semiconductor device 120. FIG. 27A is a cross-sectional view taken along line A—A shown in FIG. 27B.

As shown in FIGS. 27A and 27B, the plate 125 has a three-layer structure made up of a base part 126, an insulating layer 127 and lead parts 128 arranged in a stacked formation. The base part 126 is formed of, for example, copper (Cu) having a good thermal conductivity and a good bending-processability. The insulating layer 127 located on the base part 126 is made of, for example, polyimide resin. The lead parts 128 located on the insulating layer 127 are made of copper as in the case of the base part 126, and has a given pattern formed by etching.

The base part 126 is relatively thick enough to obtain a mechanical strength necessary for the semiconductor device base member 124. The lead parts 128 are integral with external connection terminals 122 connected to a mounting board such as a mother board, element connecting parts 30 connected to the semiconductor element 121, and second external connection terminals 131 used for a field test. Hereinafter, such second external connection terminals 131 are referred to as FT terminals 131.

The insulating layer 127 made of, for example, polyimide resin, is interposed between the base part 126 and the lead parts 128, which parts are both electrically conductive. Hence, the insulating layer 127 electrically insulates the base part 126 and the lead parts 128 from each other. The insulating layer 127 also function as an adhesive which bonds the base part 26 and the lead parts 28 together.

Figure 20:
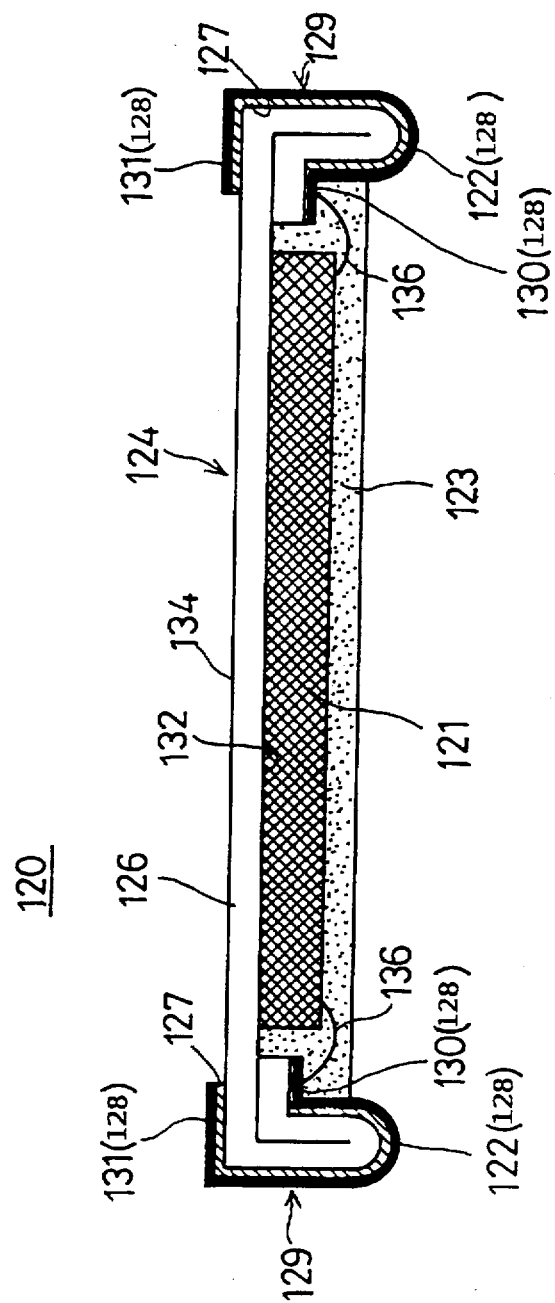
FIG. 20 is a cross-sectional view of a semiconductor device according to a seventh embodiment of the present invention.

As shown in FIG. 27B, the plate 125 has a cross shape before the bending process. The base member 124 shown in FIGS. 20 and 29 is formed by bending extensions 125a–125d extending in four orthogonal directions twice.

Figure 28A:
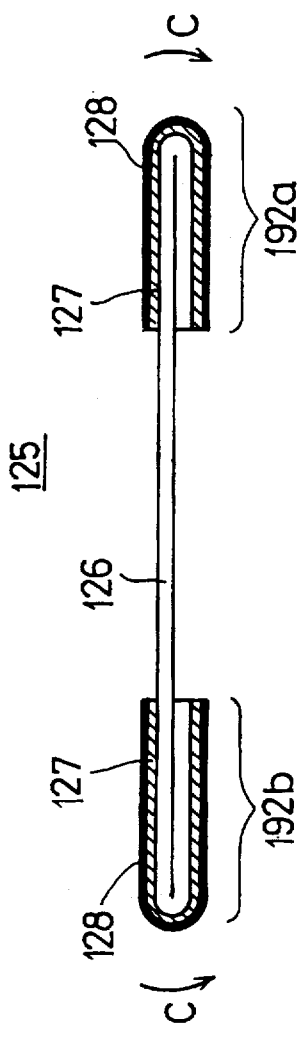
FIGS. 28A and 28B are diagrams showing a plate bending step.
Figure 28B:
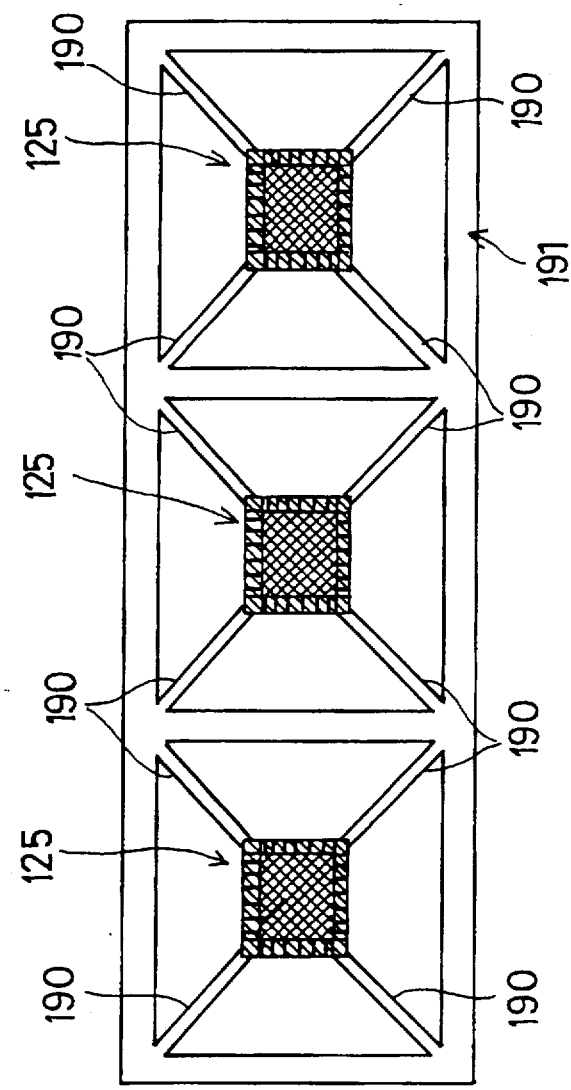

The first bending step is to bend the plate 125 so that the base part 126 are located inside, as indicated by arrow B shown in FIG. 27A. After the first bending step, the plate 125 is changed to a shape shown in FIGS. 28A and 28B. Then, the second bending step is carried out as indicated by arrow C shown in FIG. 28A. Thus, the semiconductor device base member 124 shown in FIG. 29 can be obtained.

Bent portions 129 formed in end portions of the base member 124 by the second bending step have a substantially L-shaped cross section. The other portion of the plate 125 which is not subjected to the bending step is the element mounting portion 132 on which the semiconductor element 132 can be mounted.

As described above, the plate 125 is bent so that the lead parts 128 are positioned on the outer side of the plate 125 and the base parts 126 is positioned on the inner side thereof. Hence, the lead parts 128 are automatically located on the outer sides of the bent portions 129. Portions of the lead parts 128 located inside of the bent plate 124 function as the element connecting portions 130, and top (edge) portions of the lead parts 129 form the external connection terminals 122. Further, portions of the lead parts 128 formed on a back surface 134 opposite to the element mounting portion 132 form the FT terminals 131. That is, the external connection terminals 122, the element connecting portions 130 an the FT terminals 131 are parts of the same lead parts 128.

As described above, the lead parts 128 can be easily formed by bending the plate 125 so as to form the bent portions 129, the lead parts 128 integrally including the external connection terminals 122, the element connecting portions 130 and the FT terminals 131. Hence, it is not necessary to perform a work for connecting the external connection terminals 122, the element connecting portions 130 and the FT terminals 131. As a result, the semiconductor device base member 124 can be less-expensively produced with ease.

Turning to FIG. 20 again, the semiconductor element 121 is mounted on the element mounting portion 132 of the base member 124. More particularly, the semiconductor element 121 is fixed to the element mounting portion 132 by solder which has an excellent stress buffer effect as a die attachment member 135, which may be electrically conductive paste or a tape material.

The semiconductor element 121 mounted on the element mounting portion 132 and the lead parts 128 of the bent portions 129 are electrically connected together by wires 136. Such connections can easily be made by a wire bonding apparatus which is widely used. The element connecting portions 130 are formed on the upper surfaces of the bent portions 129, so that, with respect to the element mounting portion 132, the semiconductor element 121 is approximately as high as the element mounting portions 130 (more strictly, the height of the surface to which the wires 36 are connected). This contributes to reducing the movement of a capillary of the wire bonding apparatus and facilitates the wire bonding process.

The sealing resin 123 hermetically seals the semiconductor element 121 and protects the same. As will be described later, the sealing resin 123 is filled on the upper surface of the semiconductor device base member 124 by potting (or transfer molding). The height of the sealing resin 123 measured from the element mounting portion 132 is designed to be lower than that of the bent portions 129 measured therefrom. Hence, the tip end portions of the bent portions 129 project from the sealing resin 123. In other words, the external connection terminals 122 project from the sealing resin 123.

As described above, the semiconductor device 120 has the external connection terminals 122 which are parts of the lead parts 128 located in the bent portions 129. Hence, the external connection terminals 122 are supported by the base part 126. Thus, even if an increased number of external connection terminals 122 is used and the size thereof is finer, it is possible to prevent the terminals 122 from being easily deformed.

Figure 2:
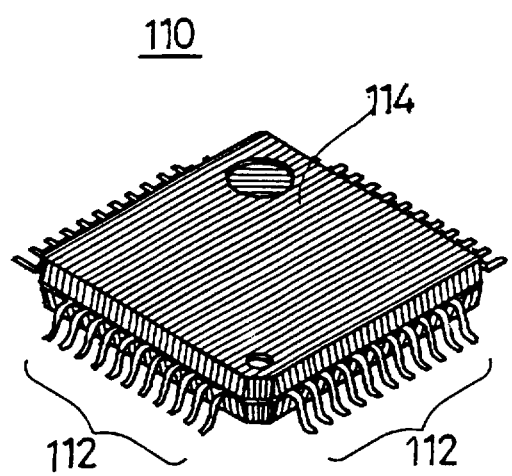
FIG. 2 is a perspective view of another conventional semiconductor device.
Figure 3:
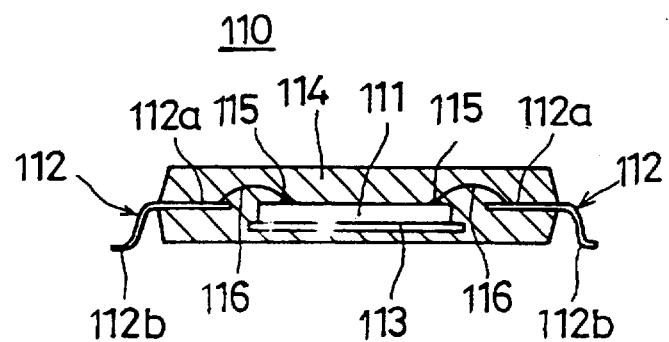
FIG. 3 is a cross-sectional view of the semiconductor device shown in FIG. 2.

The semiconductor device 120 does not need the step of repairing the external connection terminals, the step being needed for the conventional QFP type semiconductor device 110 shown in FIGS. 2 and 3. Hence, the production process can be simplified and the reliability of the semiconductor device 120 can be improved. Further, it is possible to reduce the number of parts necessary to assemble the semiconductor device 120 because the external connection terminals 122 are integral with the lead parts 128.

The base part 126 occupies most of the semiconductor device base member 124, and is made of copper. Hence, it is possible to reduce the hygroscopic degree of the base part 126, in other words, the semiconductor device base member 124.

When the semiconductor deice 120 is mounted to the mounting (mother) board 137, a heat treatment is performed in order to connect the solder bumps 122 to electrode parts 138 formed on the mounting board 137. In the heat treatment, no stream occurs due to heat because the semiconductor device base member 124 has a low hygroscopic degree. Hence, it is possible to prevent a crack in the sealing resin 123 and prevent the flake-off of the sealing resin 123 from the base member 124. As a result, the reliability of the semiconductor device 120 can be improved.

The base part 126 is formed of copper (Cu) having a good thermal conductivity, as has been described previously. Hence, it is possible to efficiently radiate heat generated in the semiconductor element 121 through the base part 126 made of a high thermal conductive material which may be copper. The portion of the semiconductor device base member 124 other than the portion in which the sealing resin 123 is provided is exposed, so that the base member 124 has a high thermal radiating efficiency. That is, the base member 124 functions as a heat radiating member, so that the semiconductor element 121 can be cooled efficiently and effectively.

The end portions of the plate 125 are inwardly bent so as to form the bent portions 129, which are close to the semiconductor element 121 mounted on the element mounting portion 132. That is, the shape of the semiconductor device base member 124 is similar to that of the semiconductor element 121, so that down-sizing of the semiconductor device 120 can be achieved.

Normally, the semiconductor device 120 is mounted on the mounting board, and the FT test is carried out in order to determine whether the semiconductor device is certainly connected to the mounting board. The semiconductor device 120 is tested by using the FT terminals 131, which are parts of the lead parts 128. A probe is connected to one of the FT terminals 131. The probe connecting work is very easy because the FT terminals 131 are provided on the back surface 134 of the base member 124. This leads to improvement in the yield and reliability of semiconductor devices.

Figure 21:
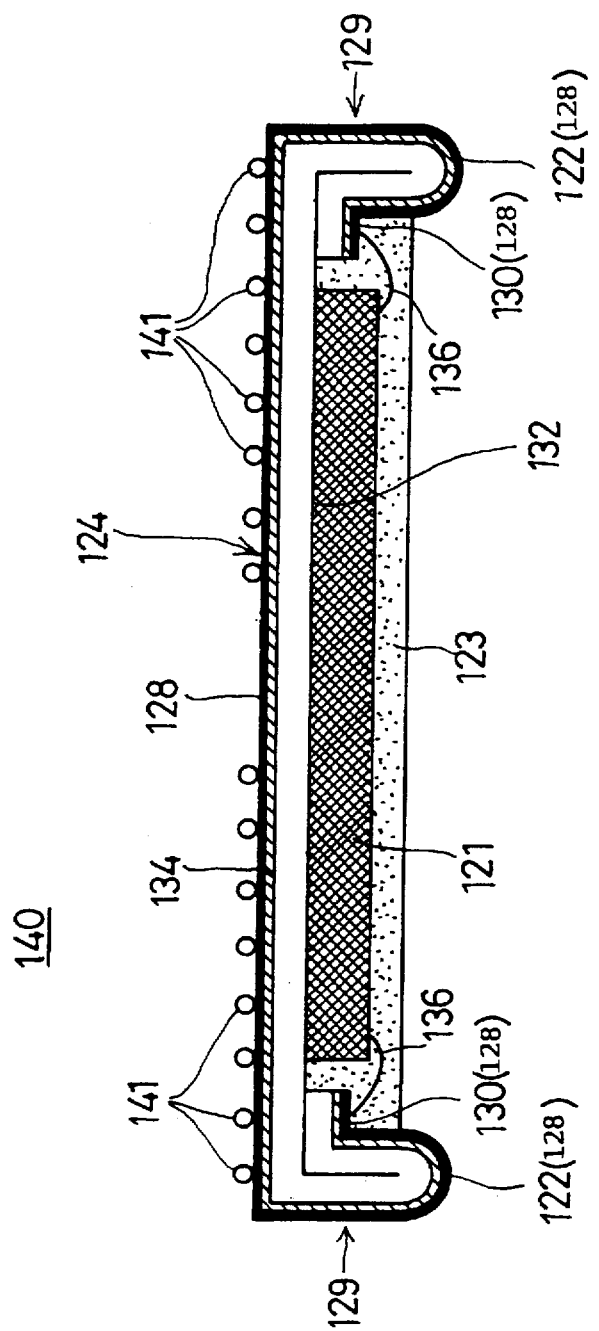
FIG. 21 is a cross-sectional view of a semiconductor device according to an eighth embodiment of the present invention.

FIG. 21 is a cross-sectional view of a semiconductor device 140 according to an eighth embodiment of the present invention. In FIG. 21, parts that are the same as those shown in the previously described figures are given the same reference numbers. The semiconductor device 140 is characterized in that the lead parts 128 including the external connection terminals 122 extend over the back surface 134 of the base member 124 opposite to the element mounting portion 132, and bumps 141 are provided on portions of the lead parts 128 extending on the back surface 134. Hence, the semiconductor device 140 can be used as a BGA device. There is no need to consider a deformation of the external connection terminals, so that the mounting process can be facilitated.

Figure 22:
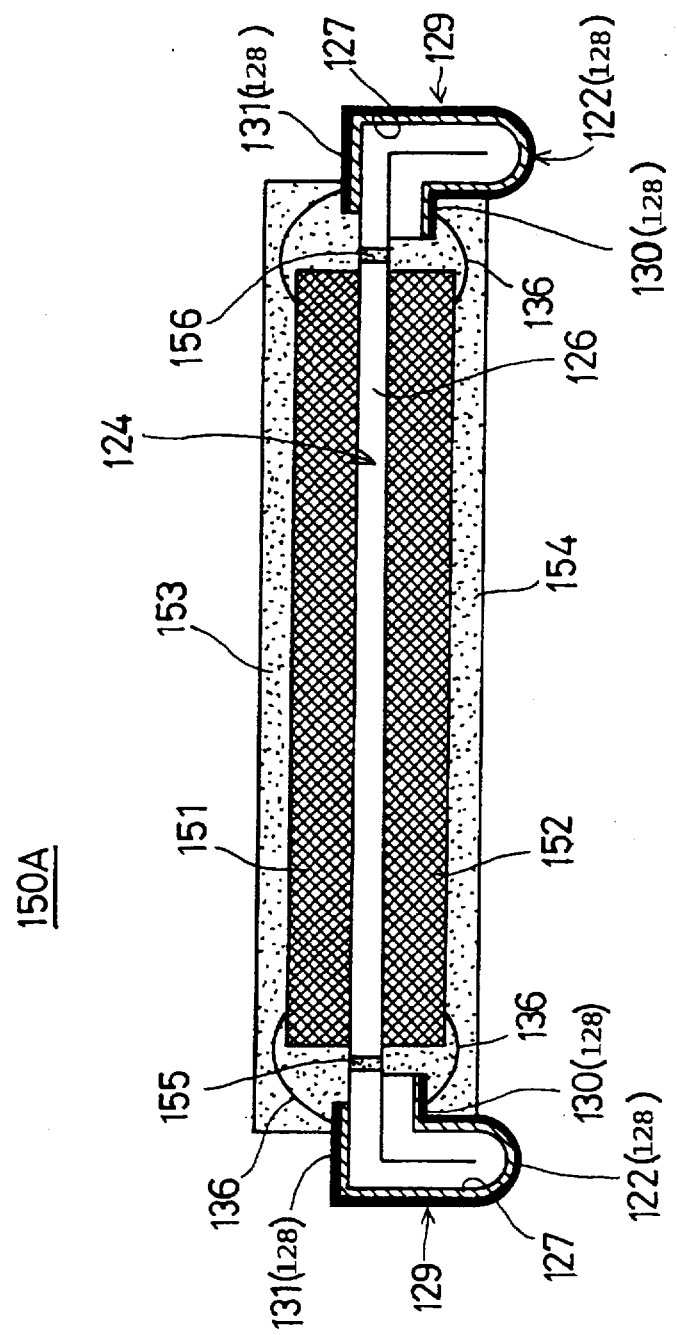
FIG. 22 is a cross-sectional view of a semiconductor device according to a ninth embodiment of the present invention.
Figure 23:
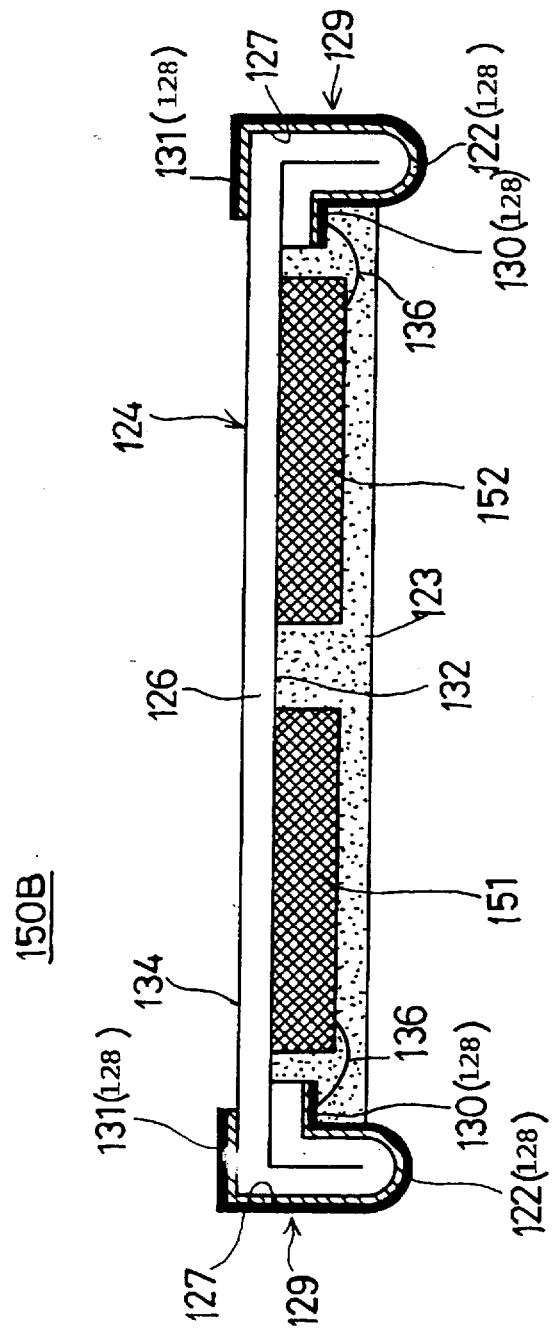
FIG. 23 is a cross-sectional view of another semiconductor device according to the ninth embodiment of the present invention.

FIGS. 22 and 23 respectively show semiconductor devices 150A and 150B according to a ninth embodiment of the present invention. In these figures, parts that are the same as those shown in the previously described figures are given the same reference numbers. The ninth embodiment of the present invention is characterized in that a plurality of semiconductor elements such as 151 and 152 are supported by semiconductor device base member 124. That is, the semiconductor devices 150A and 150B are multichip-module devices.

The semiconductor devices 150A and 150B has an increased mounting density and a substantially decreased size. Further, the semiconductor elements 151 and 152 can be arranged close to each other, so that the electrical connection resistance between them can be reduced and an increased processing speed of the semiconductor devices 150A and 150B can be obtained.

The semiconductor device 150A shown in FIG. 22 has through holes 155 and 156 formed in the base part 126. The through holes 155 and 156 enable the sealing resin 153 and 154 to be connected together. Hence, the bonding intensity of the sealing resins 153 and 154 can be improved and it is possible to flake off the sealing resins 153 and 154 from the semiconductor device base member 124.

Figure 24:
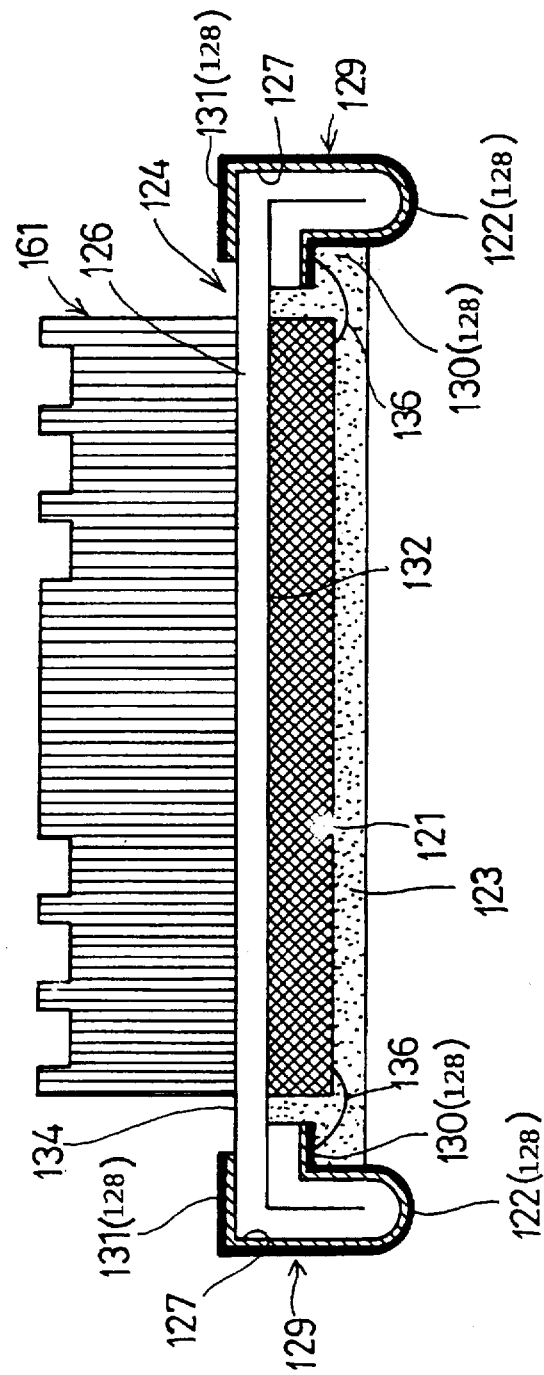
FIG. 24 is a cross-sectional view of a semiconductor device according to a tenth embodiment of the present invention.

FIG. 24 is a cross-sectional view of a semiconductor device 160 according to a tenth embodiment of the present invention. The semiconductor device 160 is characterized in that a heat radiating member 161 is provided on the back surface of the semiconductor device base member 124 (base part 126). Heat generated in the semiconductor element 121 conducts through the base part 126, and is radiated via the heat radiating member 161 thermally connected to the base part 126. Heat can be efficiently radiated through the heat radiating member 161, so that the cooling efficiency of the semiconductor element 121 can be improved.

The base part 126 is formed of a substance having a good thermal conductivity which may be copper. This facilitates the efficiency of radiating heat emitted from the semiconductor element 121.

Figure 25:
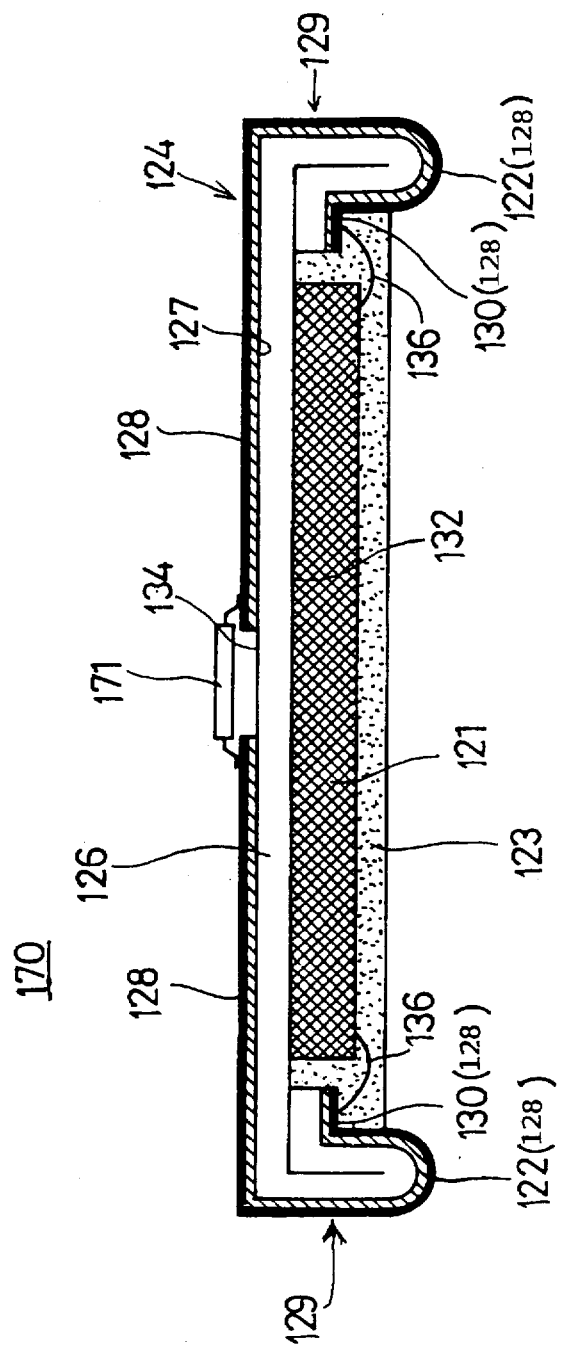
FIG. 25 is a cross-sectional view of a semiconductor device according to an eleventh embodiment of the present invention.
Figure 26:
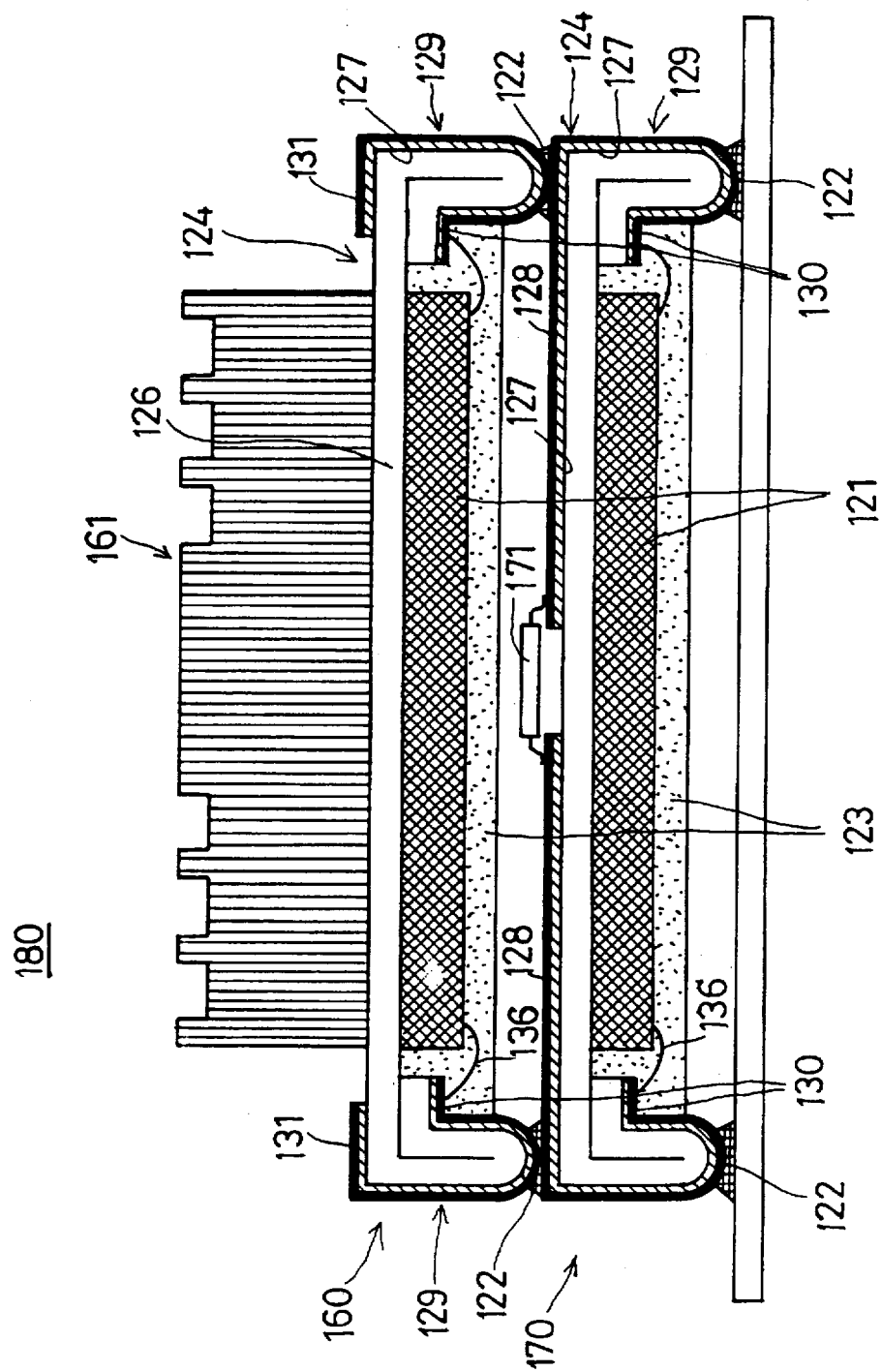
FIG. 26 is a cross-sectional view of a semiconductor device according to a twelfth embodiment of the present invention.

FIG. 25 is a cross-sectional view of a semiconductor device 170 according to an eleventh embodiment of the present invention. The semiconductor device 170 is characterized in that the lead parts 128 integral with the external connection terminals 122 extend the back surface 134 of the semiconductor device base member 124 and an electronic component 171 is connected to the lead parts 128. The back surface 134 of the semiconductor device base member 124 has a relatively large area. Hence, it is possible to provide the electronic part 171 on the back surface 134 of the semiconductor device base member 124 by providing the lead parts 128 on the back surface 134. With the above structure, it is possible to improve the density of mounting components on the mounting board on which the semiconductor device 170 is provided.

FIG. 12 is a cross-sectional view of a semiconductor device 180 according to a twelfth embodiment of the present invention, in which a plurality of semiconductor devices which are any of the semiconductor devices 140, 150A, 150B, 160 and 170 are arranged in a stacked formation. By way of example, FIG. 12 shows a structure in which the semiconductor device 160 according to the tenth embodiment of the present invention and the semiconductor device 170 according to the eleventh embodiment thereof are arranged in a stacked formation. The external connection terminals 122 of the semiconductor device 160 located on the upper side are connected to the FT terminals 131 formed on the back surface 134 of the semiconductor device 170 located on the lower side. In this manner, the semiconductor devices 160 and 170 are electrically connected to each other.

The twelfth embodiment of the present invention has an improved mounting density. The semiconductor devices which are arranged in a stacked formation are not limited to the above-described semiconductor devices, but arbitrary types of semiconductor devices may be employed. Further, the number of semiconductor devices to be stacked is not limited to two.

A description will now be given of a method of producing the semiconductor devices related to the seventh through eleventh embodiments of the present invention. The method described below is to produce the semiconductor device 120 according to the seventh embodiment of the present invention. In the following description, parts that are the same as those shown in the previously described figures are given the same reference numbers.

The following production method includes a plate forming step, a lead shaping step, a plate bending step, an element mounting step, a connecting step and a resin sealing step.

In the plate forming step, a three-layer structure made up of the base part 126, the insulating layer 127 and the lead parts 128 is formed. Next, the three-layer structure is stamped by pressing so that plates 125 each having a cross shape in plan as shown in FIG. 27B can be formed.

In FIG. 27B, the plates 125 are supported by a frame 191 by means of support bars 190. It is possible to separate these plates 125 from each other at the time of the press-stamping process.

In the above step of forming the plate 125, the lead shaping step is carried out after the base part 126, the insulating layer 127 and the lead parts 128 are stacked. Although not shown, in the lead shaping step, the lead parts 128 of each of the plates 25 are formed in a predetermined pattern. The following description will be directed to one of these plates 125 for the sake of convenience although a plurality of plates 125 supported by the frame 191 can be simultaneously processed.

More particularly, a resist is deposited, by photolithograph technique, on portions of the lead parts 128 on the plate 125, the above portions corresponding to patterned leads 128. Then, an etching step is executed to remove the unnecessary portions. Thus, the lead parts 128 having the predetermined pattern are formed.

After the lead forming step, the step of bending the plate 125 is performed. In this step, the edge portions 125a–125d of the plate 125 are bent twice so that the semiconductor device 124 shown in FIG. 29 is formed. More particularly, the first step is to bend the plate 125 so that the lead parts 128 are located on the outside of the bent structure and the base part 126 is located on the inside thereof. The direction of the first bending step is indicated by arrow B shown in FIG. 27B. The first bending step results in the structure shown in FIGS. 28A and 28B. Then, the send bending step is carried out for the structure shown in FIGS. 28A and 28B, as indicated by arrow C shown in FIG. 28A. As a result, the semiconductor device base member 124 shown in FIG. 29 is formed.

The bent portions 129 formed at the edge portions of the semiconductor device base member 124 are then processed so that they have a substantially L-shaped cross section. The lead parts 128 are located on the outside of the base member 124, while the base part 126 is located on the inside thereof. The element connecting portions 130 are formed by stepped parts of the bent portions 129 located on the inside thereof. The tip end portions of the bent portions 129 function as the external connecting terminals 122. The FT terminals 131 are formed on the back surface 134 of the base member 124. These portions can be automatically formed by bending the plate 125.

In the bending step, an adhesive may be used. For example, an adhesive is given to inner portions of the base part 26 (indicated by 125a and 125c shown in FIG. 27A) in the first bending step. In the second bending step, an adhesive is given to portions 192a and 192b shown in FIG. 28A. That is, an adhesive is given to portions to be bent inwardly. The adhesive functions to fix contact portions made by bending to each other and to prevent the bent portions 129 from being deformed due to elastically restitutive force thereof.

The plate 125 is bent by the press process, which makes it possible to precisely form the semiconductor device base member 124 with ease. Further, the punching process executed in the plate forming step and the bending process executed in the bending step can be performed by a single press apparatus. This leads to an improvement in the efficiency of the formation of a large number of semiconductor device base members 124.

Figure 30:
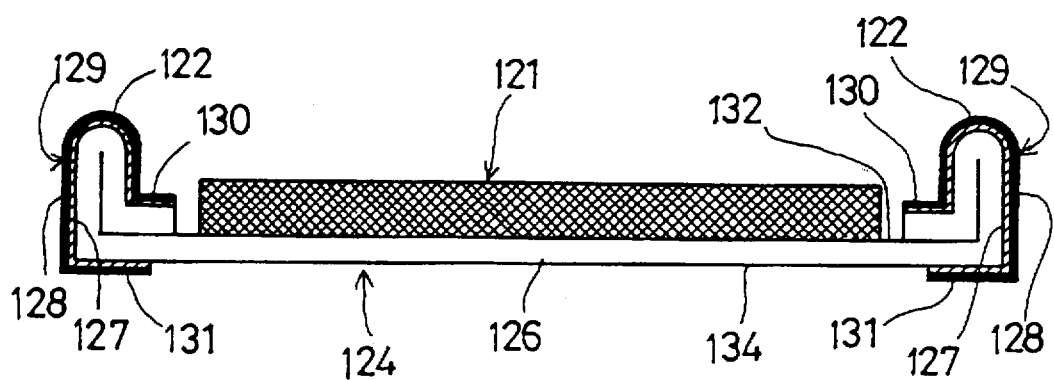
FIG. 30 is a cross-sectional view showing an element mounting step.

Subsequently, the element mounting step is executed, in which the semiconductor element 121 is placed on and fixed to the element mounting portion 132 of the base member 124 by using a bonding member such as solder. FIG. 30 shows a state in which the semiconductor element 121 is mounted on the element mounting portion 132 of the semiconductor device base member 124.

Figure 31:
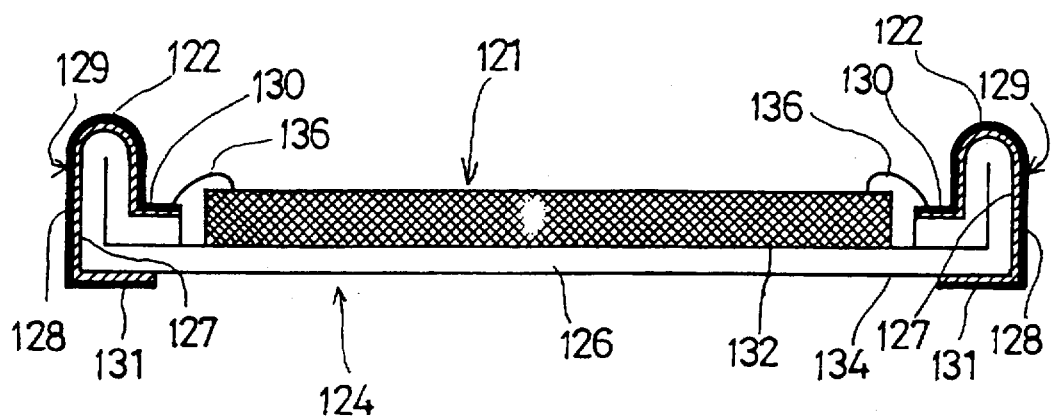
FIG. 31 is a cross-sectional view showing a connecting step.
Figure 32:
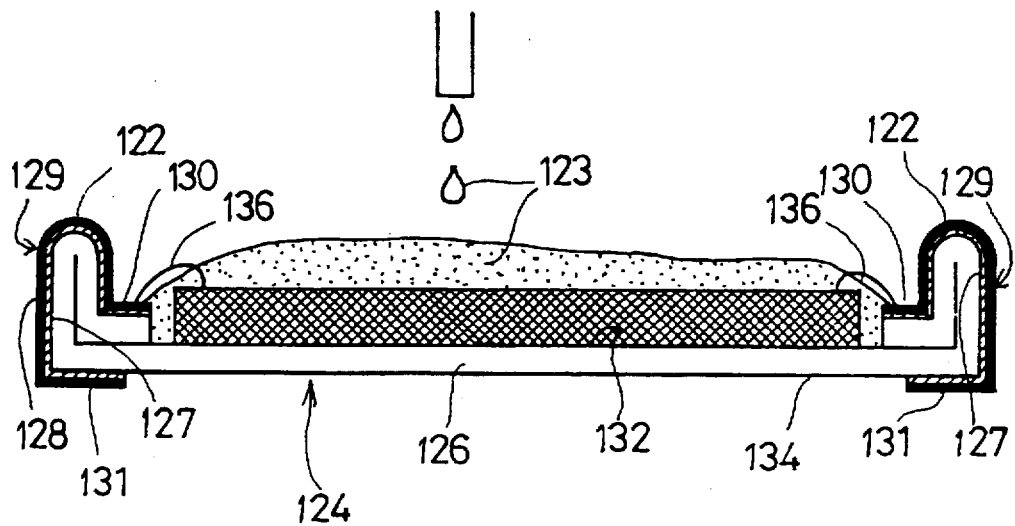
FIG. 32 is a cross-sectional view showing a resin sealing step.

A subsequent step is the connecting step using the wire bonding apparatus. In this step, the wires 136 are provided between the semiconductor element 121 and the lead parts 128. FIG. 31 shows a state in which the wires 136 are provided between the semiconductor element 121 and the lead parts 128.

Subsequent to the connecting step, the resin sealing step is performed in which the sealing resin 123 is provided from the upper side of the base member 124 by potting that the semiconductor device 121 is encapsulated. The bent portions 129 stand upright on the four sides of the element mounting portion 132, and prevent the sealing resin 123 from being leaked to the outside of the base member 124. This facilitates to the resin sealing step.

The amount of the sealing resin 123 is adjusted so that the semiconductor element 121 and the wires 136 are completely embedded, while the upper end portions of the lead parts 128 including the external connection terminals 122 are exposed. By adjusting the amount of the sealing resin 123, the external connection terminals 122 can be automatically defined. It will be noted that the step of producing the first embodiment of the present invention needs the step of forming the external connection terminals after the resin sealing step.

Finally, the semiconductor device base members 124 are separated from the support bars 190, so that a plurality of semiconductor devices 120 are formed.

In the above-described seventh through twelfth embodiments of the present invention, various variations and modifications may be made. For example, copper used to form the base member 126 can be replaced by another electrically conductive material which may be aluminum, an alloy of copper, or an alloy of iron.

The present invention is not limited to the specifically described embodiments, and variations and modifications may be made without departing from the scope of the present invention.

For example, the semiconductor device base members 24 and 124 can be handled as cases for supporting semiconductor elements or other electronic parts. When the base pars 26 and 126 made of an electrically conductive material are grounded, it is possible to stabilize the operation of the semiconductor elements mounted on the cases 24 and 124 even in a high-frequency range. In this case, SAW (Surface Acoustic Wave) chips, which can operate in a high-frequency range, can be suitably supported by the cases 24 and 124. The illustrations of the devices having the SAW filters are the same as those of the attached drawings.

What is claimed is:

1. A semiconductor device comprising:

a semiconductor element;

a semiconductor device base member having an element mounting portion on which the semiconductor element is mounted;

external connection terminals provided on the semiconductor device base member and electrically connected to the semiconductor element; and a resin sealing the semiconductor element, the semiconductor device base member comprising a base part and lead parts supported by the base part, wherein the base part and lead parts are integrally formed, the lead parts being electrically connected to the external connection terminals, the semiconductor device base member having bent portions defined by bending the semiconductor device base member, wherein the lead parts are located on outer sides of the semiconductor device base member, the bent portions being located in edge portions of the semiconductor device base member.

2. The semiconductor device as claimed in claim 1, wherein the bent portions are arranged so that the bent portions and the element mounting portion of the semiconductor device base member define gaps.

3. The semiconductor device as claimed in claim 1, wherein the bent member is made of a thermally conductive substance.

4. The semiconductor device as claimed in claim 1, wherein:

the semiconductor device base member comprises an insulating layer interposed between the base part and the lead parts; and the base part is made of an electrically conductive substance and is connected to the semiconductor element.

5. The semiconductor device as claimed in claim 1, wherein:

the semiconductor device base member has a surface opposite to that supporting the lead parts; and said surface comprises convex and concave portions.

6. The semiconductor device as claimed in claim 1, wherein said base part is made of a metallic material.

7. The semiconductor device as claimed in claim 1, further comprising wires electrically connecting the semiconductor element and the lead parts located in the bent portions of the semiconductor device base member together.

8. The semiconductor device as claimed in claim 1, wherein the bent portions comprise projections which are in contact with the element mounting portion of the semiconductor device base member.

9. The semiconductor device as claimed in claim 1, further comprising a tape-automated bonding wires electrically connecting the semiconductor element and the lead parts located in the bent portions of the semiconductor device base member.

10. The semiconductor device as claimed in claim 1, wherein the external connection terminals comprise bumps provided on the lead parts.

11. A semiconductor device base member for supporting a semiconductor element of a semiconductor device, said semiconductor device base member comprising:

a base part;

lead parts supported by the base part and connectable to said semiconductor element, wherein the base part and lead parts are integrally formed; and bent portions defined by bending the semiconductor device base member, wherein the bent portions are located in edge portions of the semiconductor device base member, the lead parts being located on outer sides of the semiconductor device base member.

12. The semiconductor device base member as claimed in claim 11, wherein the base member is made of a thermally conductive substance.

13. The semiconductor device base member as claimed in claim 11, further comprising an insulating layer interposed between the base part and the lead parts, the base part being made of an electrically conductive substance and being connected to the semiconductor element.

14. The semiconductor device base member as claimed in claim 11, wherein the bent portions comprise projections which are in contact with the element mounting portion of the semiconductor device base member.

15. A semiconductor device comprising:

a semiconductor element;

a semiconductor device base member having an element mounting portion on which the semiconductor element is mounted; and a resin sealing the semiconductor element, the semiconductor device base member comprising a base part and lead parts supported by the base part, wherein the base part and lead parts are integrally formed, the lead parts being electrically connected to the semiconductor element, the semiconductor device base member having bent portions defined by bending the semiconductor device base member, wherein the lead parts are located on outer sides of the semiconductor device base member, the bent portions being located in edge portions of the semiconductor device base member and exposed from the resin, the bent portions functioning as external connection terminals electrically connected to the semiconductor element.

16. The semiconductor device as claimed in claim 15, wherein the bent portions comprise element connecting portions which are part of the lead parts and are close to the semiconductor element.

17. The semiconductor device as claimed in claim 16, wherein the element connecting portions are located at a level approximately equal to that of a top of the semiconductor element.

18. The semiconductor device as claimed in claim 15, wherein:

the lead parts extend on a back surface of the semiconductor device base member opposite to the element mounting portion thereof; and the lead parts extending on the back surface function as second external connection terminals.

19. The semiconductor device as claimed in claim 15, wherein the base part is made of a metallic substance.

20. The semiconductor device as claimed in claim 15, wherein the base part is made of a thermally conductive substance.

21. The semiconductor device as claimed in claim 15, further comprising a heat radiating member provided on a surface of the base part opposite to the element mounting portion.

22. The semiconductor device as claimed in claim 15, wherein:

the lead parts extend on a back surface of the semiconductor device base member opposite to the element mounting portion thereof; and the semiconductor device further comprise bumps connected to the lead parts extending on the back surface.

23. A semiconductor device comprising a plurality of semiconductor devices arranged in a stacked formation, each of the plurality of semiconductor devices comprising:

a semiconductor element;

a semiconductor device base member having an element mounting portion on which the semiconductor element is mounted; and a resin sealing the semiconductor element, the semiconductor device base member comprising a base part and lead parts supported by the base part, wherein the base part and lead parts are integrally formed, the lead parts being electrically connected to the semiconductor element, the semiconductor device base member having bent portions defined by bending the semiconductor device base member, wherein the lead parts are located on outer sides of the semiconductor device base member, the bent portions being located in edge portions of the semiconductor device base member and exposed from the resin, the bent portions functioning as first external connection terminals electrically connected to the semiconductor element, the lead parts extending on a back surface of the semiconductor device base member opposite to the element mounting portion thereof, the lead parts extending on the back surface function as second external connection terminals, the first external connection terminals of an upper one of the semiconductor devices being in contact with the second external connection terminals of a lower one of the semiconductor devices.

24. A case for supporting an element comprising:

a base member having an element mounting portion on which the element is mounted; and external connection terminals provided on the base member and electrically connected to the element, the base member comprising a base part and lead parts supported by the base part, wherein the base part and lead parts are integrally formed, the lead parts being electrically connected to the external connection terminals, the base member having bent portions defined by bending the base part, wherein the lead parts are located on outer sides of the base member, the bent portions being located in edge portions of the base member.

25. A case for supporting an element comprising:

a base member having an element mounting portion on which the element is mounted, the base member comprising a base part and lead parts supported by the base part, wherein the base part and lead parts are integrally formed.

the lead parts being electrically connected to the element, the base member having bent portions defined by bending the base part, wherein the lead parts are located on outer sides of the base member, the bent portions being located in edge portions of the base member, the bent portions functioning as external connection terminals electrically connected to the element.

26. A device comprising:

a SAW element;

a base member having an element mounting portion on which the SAW element is mounted;

external connection terminals provided on the base member and electrically connected to the SAW element; and a resin sealing the SAW element, the base member comprising a base part and lead parts supported by the base part, said base part being connectable to ground, wherein the base part and lead parts are integrally formed, the lead parts being electrically connected to the external connection terminals, the base member having bent portions defined by bending the base part, wherein the lead parts are located on outer sides of the base member, the bent portions being located in edge portions of the base member.

27. A device comprising:

a SAW element;

a base member having an element mounting portion on which the SAW element is mounted; and a resin sealing the SAW element, the base member comprising a base part and lead parts supported by the base part, said base part being connectable to ground, wherein the base part and lead parts are integrally formed, the lead parts being electrically connected to the SAW element, the base member having bent portions defined by bending the base member, wherein the lead parts are located on outer sides of the base member, the bent portions being located in edge portions of the base member and exposed from the resin, the bent portions functioning as external connection terminals electrically connected to the SAW element.

* * * * *